(12) United States Patent
Paek et al.

(10) Patent No.: US 11,532,797 B2
(45) Date of Patent: Dec. 20, 2022

(54) DISPLAY APPARATUS INCLUDING GLASS SUBSTRATES

(71) Applicant: LG Display Co., Ltd., Seoul (KR)

(72) Inventors: SeungHan Paek, Paju-si (KR); Kyungjae Yoon, Paju-si (KR); HyunJin An, Paju-si (KR); Seongwoo Park, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 99 days.

(21) Appl. No.: 17/133,850

(22) Filed: Dec. 24, 2020

(65) Prior Publication Data

US 2021/0202868 A1 Jul. 1, 2021

(30) Foreign Application Priority Data

Dec. 31, 2019 (KR) .................. 10-2019-0180109

(51) Int. Cl.
*H01L 51/00* (2006.01)
*H01L 51/50* (2006.01)
(Continued)

(52) U.S. Cl.
CPC ........ *H01L 51/0097* (2013.01); *H01L 27/323* (2013.01); *H01L 27/3234* (2013.01);
(Continued)

(58) Field of Classification Search
CPC ............. H01L 51/0097; H01L 51/524; H01L 51/5237; H01L 51/5253; H01L 51/5246; H01L 51/5088; H01L 51/5092; H01L 51/5056; H01L 51/5072; H01L 2251/5338; H01L 2251/301; H01L 27/323; H01L 27/3234; H01L 27/3244; H01L 27/3276; H01L 27/3253; H01L 27/14678; H01L 27/3211; H01L 27/3251; G02F 1/13331; G02F 1/133305; G02F 2001/133357; G06F 3/0412; G06F 1/1652; G06F 1/1641; G09G 2300/0408; G09G 2300/0804
See application file for complete search history.

(56) References Cited

U.S. PATENT DOCUMENTS

2009/0284904 A1 11/2009 Wu et al.
2014/0306941 A1 10/2014 Kim et al.
(Continued)

FOREIGN PATENT DOCUMENTS

CN 207216301 U 4/2018
KR 10-2019-0006148 A 1/2019
(Continued)

OTHER PUBLICATIONS

Office Action issued by the Tiawanese Patent Office corresponding to TW Patent Application No. 109146882, dated Dec. 27, 2021.

*Primary Examiner* — Ida M Soward
(74) *Attorney, Agent, or Firm* — Morgan, Lewis & Bockius LLP

(57) ABSTRACT

A display apparatus includes a display area, a non-display area surrounding the display area, and a bending area formed in at least one side of the non-display area. The display apparatus includes a first glass substrate provided in the display area, a second glass substrate provided in the non-display area, and a flexible substrate provided to overlap the bending area.

15 Claims, 16 Drawing Sheets

(51) Int. Cl.
*H01L 51/52* (2006.01)
*H01L 27/32* (2006.01)
*H01L 27/14* (2006.01)
*G02F 1/13* (2006.01)
*H01L 51/56* (2006.01)
*G06F 1/16* (2006.01)
*H01L 27/146* (2006.01)
*G02F 1/1333* (2006.01)

(52) U.S. Cl.
CPC ........ *H01L 27/3244* (2013.01); *H01L 51/524* (2013.01); *H01L 51/5253* (2013.01); *H01L 51/56* (2013.01); *G02F 1/133305* (2013.01); *G02F 1/133331* (2021.01); *G06F 1/1641* (2013.01); *G06F 1/1652* (2013.01); *G09G 2300/0408* (2013.01); *G09G 2300/0804* (2013.01); *H01L 27/14678* (2013.01); *H01L 27/3211* (2013.01); *H01L 27/3251* (2013.01); *H01L 51/5056* (2013.01); *H01L 51/5072* (2013.01); *H01L 51/5088* (2013.01); *H01L 51/5092* (2013.01); *H01L 51/5246* (2013.01); *H01L 2227/323* (2013.01); *H01L 2251/301* (2013.01); *H01L 2251/5338* (2013.01)

(56) References Cited

U.S. PATENT DOCUMENTS

| | | | |
|---|---|---|---|
| 2018/0004053 A1* | 1/2018 | Kawata | G02F 1/136286 |
| 2018/0212169 A1* | 7/2018 | Goto | H01L 51/0097 |
| 2019/0011605 A1 | 1/2019 | Park et al. | |
| 2019/0324567 A1* | 10/2019 | Hong | H01L 51/5281 |
| 2019/0340959 A1* | 11/2019 | Park | H01L 27/322 |
| 2019/0393444 A1* | 12/2019 | Nam | H01L 27/326 |
| 2020/0004295 A1* | 1/2020 | Paek | G06F 1/1641 |
| 2020/0105853 A1* | 4/2020 | Kwon | H01L 51/5237 |
| 2020/0127231 A1* | 4/2020 | Yun | H01L 27/323 |
| 2020/0136069 A1* | 4/2020 | Paek | B32B 3/28 |
| 2020/0142242 A1* | 5/2020 | Kikuchi | G02B 6/0088 |
| 2020/0176520 A1* | 6/2020 | Kim | H01L 51/5253 |
| 2020/0209925 A1* | 7/2020 | Paek | G09F 9/301 |
| 2021/0212229 A1 | 7/2021 | Yeum et al. | |
| 2022/0077193 A1* | 3/2022 | Shin | G06F 3/0443 |

FOREIGN PATENT DOCUMENTS

| | | |
|---|---|---|
| KR | 10-2020-0049329 A | 5/2020 |
| TW | I379261 B | 12/2012 |
| TW | I549571 B | 9/2016 |
| TW | 201823823 A | 7/2018 |
| WO | 2019/187567 A1 | 10/2019 |

\* cited by examiner

DISPLAY APPARATUS INCLUDING GLASS SUBSTRATES

CROSS-REFERENCE TO RELATED APPLICATIONS

This application claims the benefit of the Korean Patent Application No. 10-2019-0180109 filed on Dec. 31, 2019 which is hereby incorporated by reference as if fully set forth herein.

BACKGROUND

Technical Field

The present disclosure relates to a display apparatus.

Discussion of the Related Art

Generally, a display apparatus is widely used as a display screen of various electronic devices such as a mobile communication terminal, an electronic diary, an electronic book, a portable multimedia player (PMP), a navigator, an Ultra Mobile PC (UMPC), a mobile phone, a smart phone, a tablet personal computer (PC), a watch phone, an electronic pad, a wearable device, a watch phone, a portable information device, a vehicle control display device, a television, a notebook computer, and a monitor.

Studies and development for embodying a liquid crystal display apparatus, a light emitting display apparatus and an electrophoresis display apparatus among display apparatuses as flexible display apparatuses, each of which is able to become a thin profile and has a minimized bezel area, are ongoing. To this end, use of a flexible substrate is required.

In a manufacturing method of a display apparatus to which a conventional flexible display panel is applied, after a laser sacrificial layer and a flexible substrate are sequentially formed on a mother glass substrate, a manufacturing process of the flexible display panel is completed. Then, the mother glass substrate is detached from the flexible substrate through a laser release process for irradiating lasers to the laser sacrificial layer, whereby the flexible display panel is manufactured.

In the manufacturing method of the display apparatus to which a conventional flexible substrate is applied, since an expensive laser equipment is used to detach the mother glass substrate from the flexible substrate, a manufacturing cost is increased, and a laser release related defect (particles or transfer according to surface roughness of the flexible substrate) may be generated. Particularly, as a flexible substrate material that occupies a half level of the manufacturing cost of the flexible display panel is coated on an entire surface of the mother glass substrate, material consumption is high and therefore production cost is increased.

Also, recently, studies and development of a display apparatus that may embody a maximum screen by reducing a bezel area where an image is not displayed in a size of the same display panel are ongoing.

SUMMARY

The inventors of the present disclosure have continuously studied and developed technologies that can replace a laser release process, and have invented a display apparatus of a new structure, which may be manufactured without the laser release process.

Accordingly, embodiments of the present disclosure are directed to a display apparatus that substantially obviates one or more of the problems due to limitations and disadvantages of the related art.

An aspect of the present disclosure is to provide a display apparatus that may be manufactured without a laser lease process for detaching a mother glass substrate from a flexible substrate.

Another aspect of the present disclosure is to provide a display apparatus in which reliability is improved and a width of a bezel area may be minimized.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, a display apparatus comprises a display area, a non-display area surrounding the display area, and a bending area formed in at least one side of the non-display area, wherein the display apparatus comprises a first glass substrate provided in the display area, a second glass substrate provided in the non-display area, and a flexible substrate provided to overlap the bending area.

In another aspect, a display apparatus comprises a hole area, a bezel area surrounding the hole area, and a display area surrounding the bezel area, wherein the display apparatus comprises a base substrate overlapped with the hole area, the bezel area and the display area, a thin film transistor provided on the base substrate and overlapped with the display area, a light emitting diode provided on the thin film transistor and electrically connected with the thin film transistor, an encapsulation portion covering the light emitting diode, and an optical module arranged to overlap the hole area and arranged below the base substrate.

The present disclosure may provide a display apparatus that may be manufactured without a laser lease process for detaching a mother glass substrate from a flexible substrate. Also, the present disclosure may provide a display apparatus in which reliability is improved and a width of a bezel area may be minimized.

In the display apparatus according to one embodiment of the present disclosure, since a flexible substrate is not arranged in an area corresponding to a display area, luminance and residual image characteristics of the display area due to the flexible substrate may be improved.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings:

FIG. 6b is a cross-sectional view taken along line shown in FIG. 6a;

FIG. 7b is a cross-sectional view taken along line IV-IV' shown in FIG. 7a;

DETAILED DESCRIPTION

Figure 1:
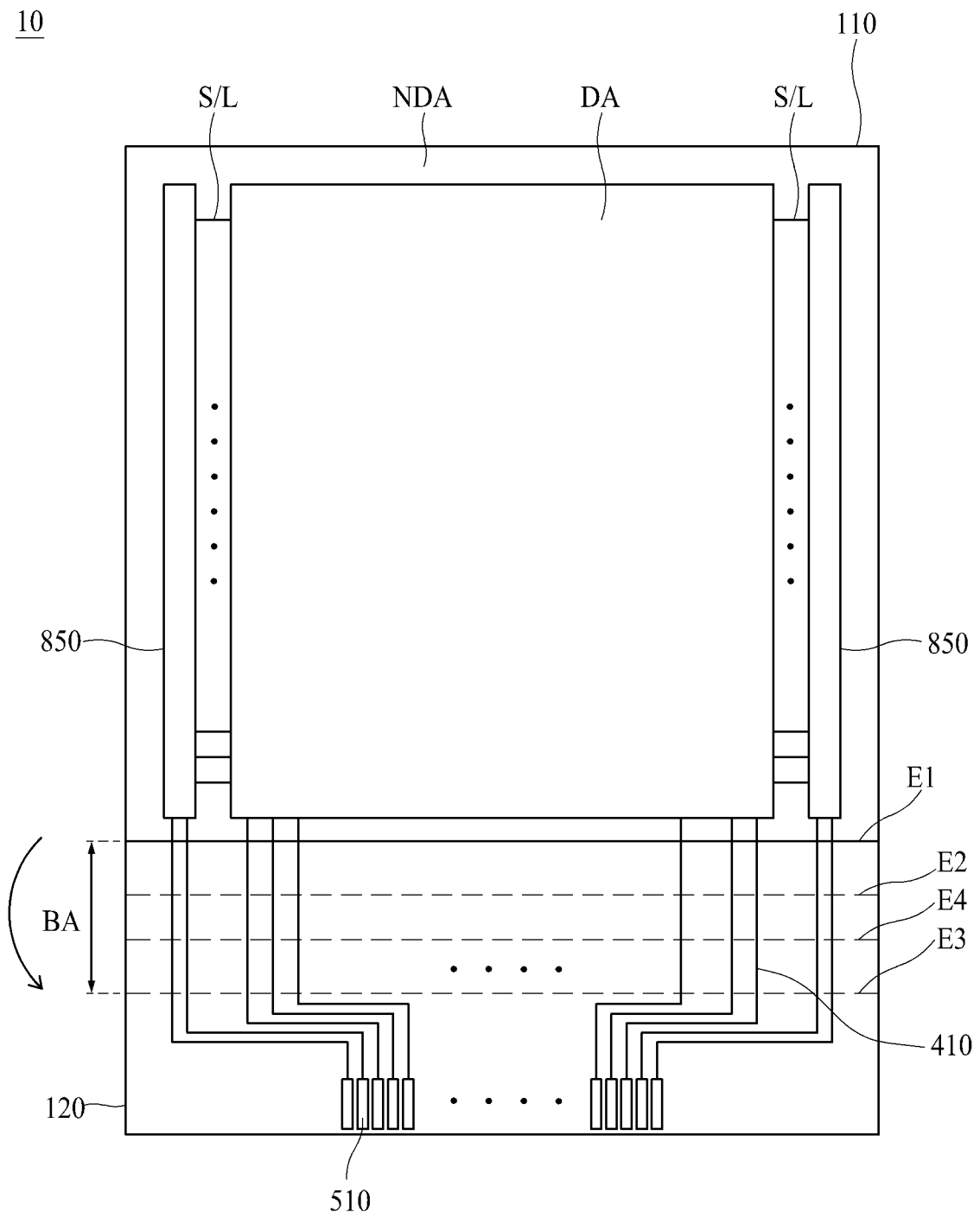
FIG. 1 is a plane view illustrating a display apparatus according to one embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~', 'above~', 'below~', and 'next to~', one or more portions may be arranged between two other portions unless 'just' or 'direct' is used.

In describing a time relationship, for example, when the temporal order is described as 'after~', 'subsequent~', 'next~', and 'before~' a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, a display apparatus according to the present disclosure will be described in detail with reference to the accompanying drawings. Wherever possible, the same reference numbers will be used throughout the drawings to refer to the same or like parts. Since a scale of each of elements shown in the accompanying drawings is different from an actual scale for convenience of description, the present disclosure is not limited to the shown scale.

Figure 2:
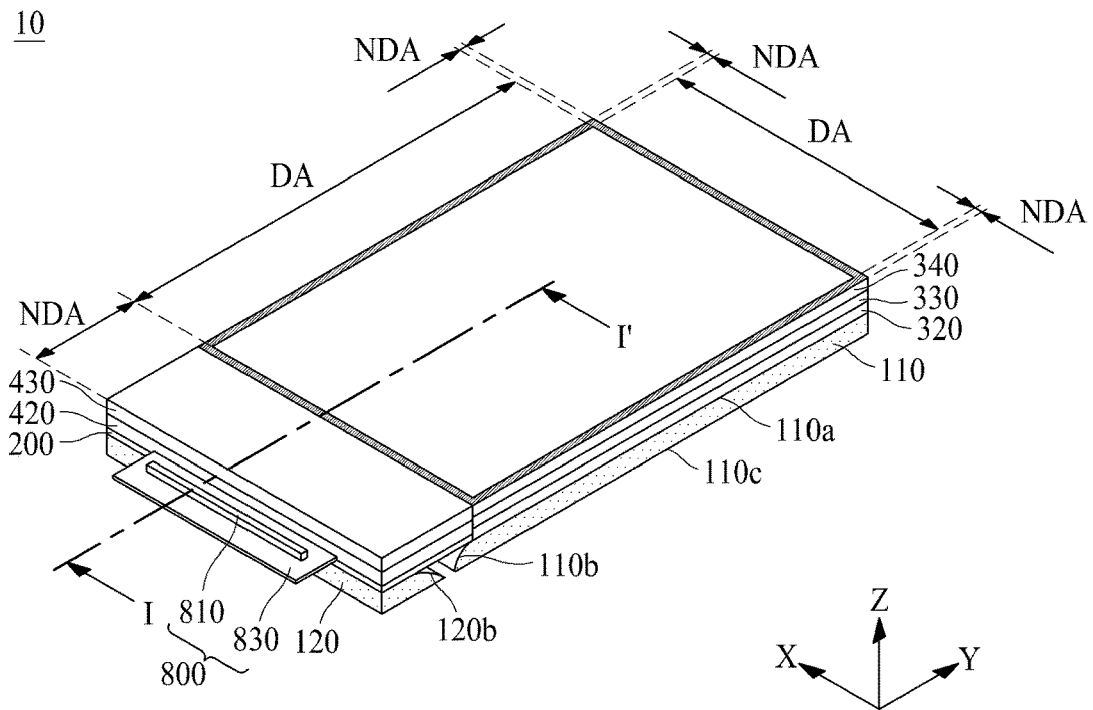
FIG. 2 is a perspective view illustrating a display apparatus according to one embodiment of the present disclosure.
Figure 3:
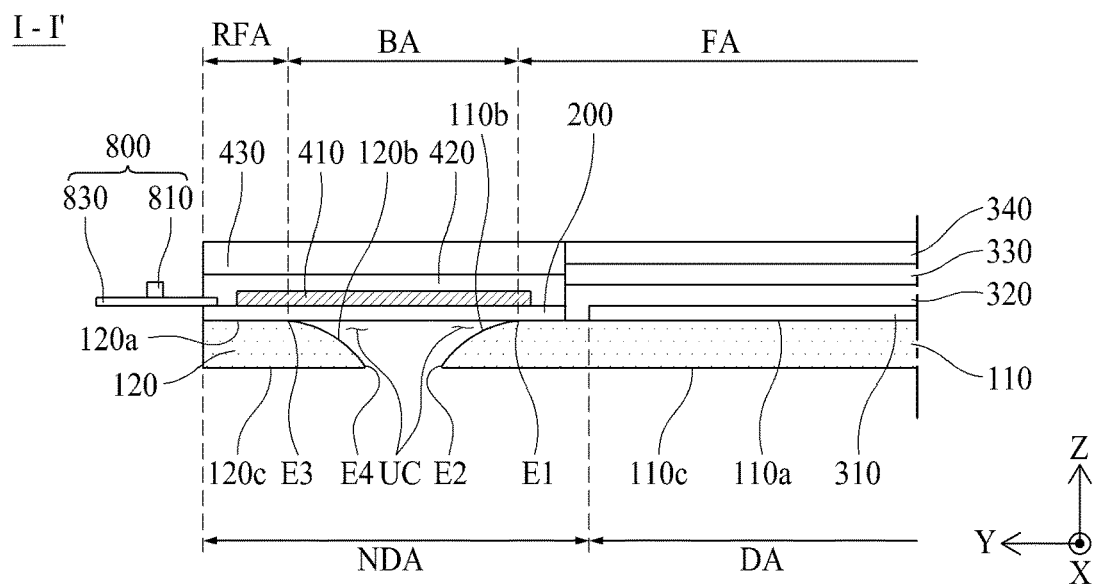
FIG. 3 is a cross-sectional view taken along line I-I' shown in FIG. 2.

FIG. 1 is a plane view illustrating a display apparatus 10 according to one embodiment of the present disclosure, FIG. 2 is a perspective view illustrating a display apparatus 10 according to one embodiment of the present disclosure, and FIG. 3 is a cross-sectional view taken along line I-I' shown in FIG. 2.

Referring to FIGS. 1 to 3, the display apparatus 10 according to one embodiment of the present disclosure comprises a display area DA arranged on a first glass substrate 110 and a non-display area NDA surrounding the display area DA, and also comprises a flexible substrate 200.

The display area DA is an area where an image is displayed, and may include a plurality of pixels. The display area DA may be supported by a first flat surface 110a of the first glass substrate 110. The plurality of pixels may be arranged in the form of matrix, each of the pixels may include subpixels. The display area DA may substantially have a rectangular shape. However, embodiments of the present disclosure are not limited to the rectangular shape, and the display area DA may have a random polygonal shape. For example, the display area DA may have a triangle, a pentagonal shape and a hexagonal shape in accordance with a shape of the display apparatus. In the present disclosure, for convenience of description, the display area DA having a rectangular shape according to the display apparatus 10 of a rectangular shape will be described.

The non-display area NDA is an area surrounding the display area DA, and elements and circuit lines for driving the display area DA may be arranged in the non-di splay area NDA.

A bending area BA may be defined as an area provided such that the display apparatus 10 is partially bent. Therefore, the display apparatus 10 according to one embodiment of the present disclosure may be bent to have a certain curvature radius in accordance with bending of the bending area BA.

Also, in the display apparatus 10 according to one embodiment of the present disclosure, a flat area FA, a bending area BA, and a rear flat area RFA may be defined. In this case, since the bending area BA is the same as the aforementioned bending area, its description will be omitted.

The flat area FA may be defined as an area overlapped with the first flat surface 110*a* of the first glass substrate 110. Also, the flat area FA may include an area overlapped with the display area DA and a predetermined non-display area NDA surrounding the display area DA.

The rear flat area RFA may be defined as an area which is overlapped with a second flat surface 120*a* of a second glass substrate 120 and not overlapped with the bending area BA. The rear flat area RFA may be provided with a panel driving circuit 800.

The first glass substrate 110 may include a first etching surface 110*b* provided to overlap the bending area BA. In this case, the case that the first etching surface 110*b* is overlapped with the bending area BA may mean that the first etching surface 110*b* is headed for a rear surface of the flexible substrate 200 overlapped with the bending area BA. Also, if the bending area BA of the display apparatus 10 is not provided with the first etching surface 110*b*, since the display apparatus 10 cannot be bent, the bending area BA of the display apparatus 10 may be defined to overlap the first etching surface 110*b*.

Also, the first glass substrate 110 may include a first flat surface 110*a* and a first etching surface 110*b* arranged at one side of the first flat surface 110*a*, and may further include a first rear surface 110*c* facing the first flat surface 110*a*.

Also, the first glass substrate 110 may be defined by a first end E1 which is a boundary between the first flat surface 110*a* and the first etching surface 110*b* and a second end E2 which is a boundary between the first etching surface 110*b* and the first rear surface 110*c*. An inclination of the first etching surface 110*b* may be defined by an inclined surface connecting the first end E1 with the second end E2. Referring to FIGS. 2 and 3, although the first etching surface 110*b* is shown to have a convex curved surface, the embodiment of the present disclosure is not limited to this example. Various shapes of the first etching surface 110*b* will be described later with reference to FIGS. 9 and 10.

The second glass substrate 120 may include a second etching surface 120*b* provided to overlap the bending area BA. In this case, the case that the second etching surface 120*b* is overlapped with the bending area BA may mean that the second etching surface 120*b* is headed for the rear surface of the flexible substrate 200 overlapped with the bending area BA. Also, if the bending area BA of the display apparatus 10 is not provided with the second etching surface 120*b*, since the display apparatus 10 cannot be bent, the bending area BA of the display apparatus 10 may be defined to overlap the second etching surface 120*b*.

Also, the second glass substrate 120 may include a second flat surface 120*a* and a second etching surface 120*b* arranged at one side of the second flat surface 120*a*, and may further include a second rear surface 120*c* facing the second flat surface 120*a*.

The first glass substrate 110 and the second glass substrate 120 may include a glass material. The first glass substrate 110 and the second glass substrate 120 according to one example may have a thickness of 0.01 mm to 1.0 mm to maintain flatness of the first flat surface 110*a* and the second flat surface 120*a* or shield water or oxygen from being permeated into the display apparatus 10. However, the thickness of the first glass substrate 110 and the second glass substrate 120 is not limited to the above example, and may be changed depending on a design condition of the display apparatus 10.

Also, if the first etching surface 110*b* of the first glass substrate 110 and the second etching surface 120*b* of the second glass substrate 120 are formed as shown in FIG. 2, the etching surfaces may be considered to have an undercut UC structure or an inverse tapered shape. In this case, the undercut UC may mean that the first end E1 and a third end E3 are formed to be wider than an opening pattern for etching when it is assumed that the second end E2 and a fourth end E4 correspond to the opening pattern. A detailed structure of the first etching surface 110*b* of the first glass substrate 110 and the second etching surface 120*b* of the second glass substrate 120 will be described later with reference to FIGS. 9 and 10.

As the first etching surface 110*b* and the second etching surface 120*b* according to one embodiment of the present disclosure are formed by a glass etching process at the same time, these etching surfaces may have the same shape within an etching process error range. For example, if the first etching surface 110*b* and the second etching surface 120*b* are formed in a streamlined shape, these etching surfaces may have the same circular curvature or oval curvature. If the first etching surface 110*b* and the second etching surface 120*b* are formed in an oblique shape, these etching surfaces may have the same inclination. If the first etching surface 110*b* and the second etching surface 120*b* are formed in a stair shape, these etching surfaces may be formed in a stair shape having the same step difference.

According to one example, the first glass substrate 110 and the second glass substrate 120 may include, but not limited to, a soda-lime glass or a non-alkali glass. The first glass substrate 110 and the second glass substrate 120 may include glass widely used to manufacture a flat display panel. Moreover, the first glass substrate 110 and the second glass substrate 120 may include any one or a deposited structure of sapphire glass and gorilla glass.

The first glass substrate 110 according to one example may have a thickness of 0.01 mm to 1 mm to maintain flatness of the display apparatus 10 or shield water or oxygen from being permeated into the display apparatus 10, but its thickness may be changed depending on a size of the display apparatus 10 without being limited to this example. The first glass substrate 110 according to another example may have a thickness of 0.01 mm to 0.5 mm to be bent together with the display apparatus 10 while shielding water or oxygen from being permeated into a pixel array layer 310 of the display area, but its thickness may be changed depending on a size of the display apparatus 10 without being limited to this example.

The flexible substrate 200 may be overlapped with the bending area BA, and may be formed to overlap the first etching surface 110*b* of the first glass substrate 110 and the second etching surface 120*b* of the second glass substrate 120. Also, as shown in FIGS. 1 and 2, the flexible substrate 200 may be provided on the first flat surface 110*a* and the second flat surface 120*a*.

The flexible substrate 200 may include any one of polyimide, photo acryl, polyurethane and silicone based organic matter, for example. The flexible substrate 200 may be formed in an area overlapped with the first etching surface 110*b* of the first glass substrate 110, the second etching surface 120*b* of the second glass substrate 120 and the second flat surface 120a at a certain thickness and then hardened by a hardening process.

A thickness of the flexible substrate 200 may be set to 10 μm or less. If the thickness of the flexible substrate 200 exceeds 10 μm, a step difference may occur in a boundary portion of the bending area BA and the display area DA, and it is likely that disconnection of a link line portion 410 overlapped with the flexible substrate 200 of the bending area BA due to occurrence of stress caused by the step difference may occur.

Figure 8A:
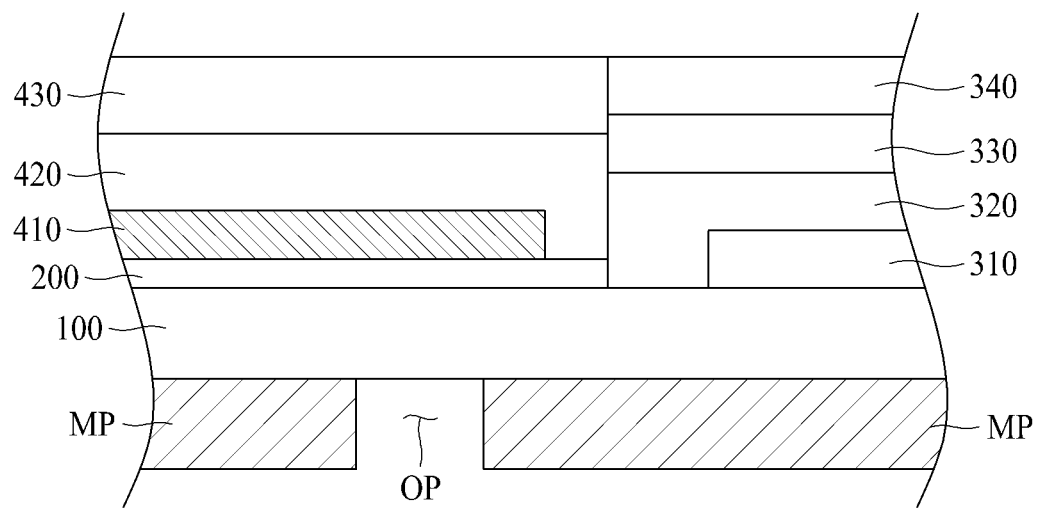
FIGS. 8a to 8c are cross-sectional views illustrating a manufacturing method of a first etching surface of a first glass substrate and a second etching surface of a second glass substrate in a display apparatus according to the present disclosure.
Figure 8B:
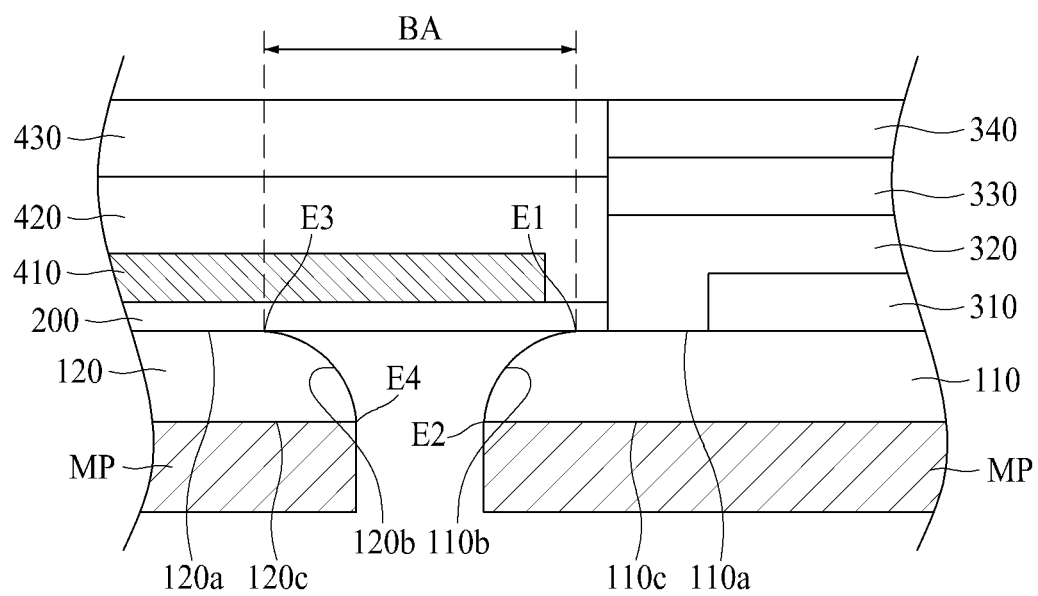
Figure 8C:
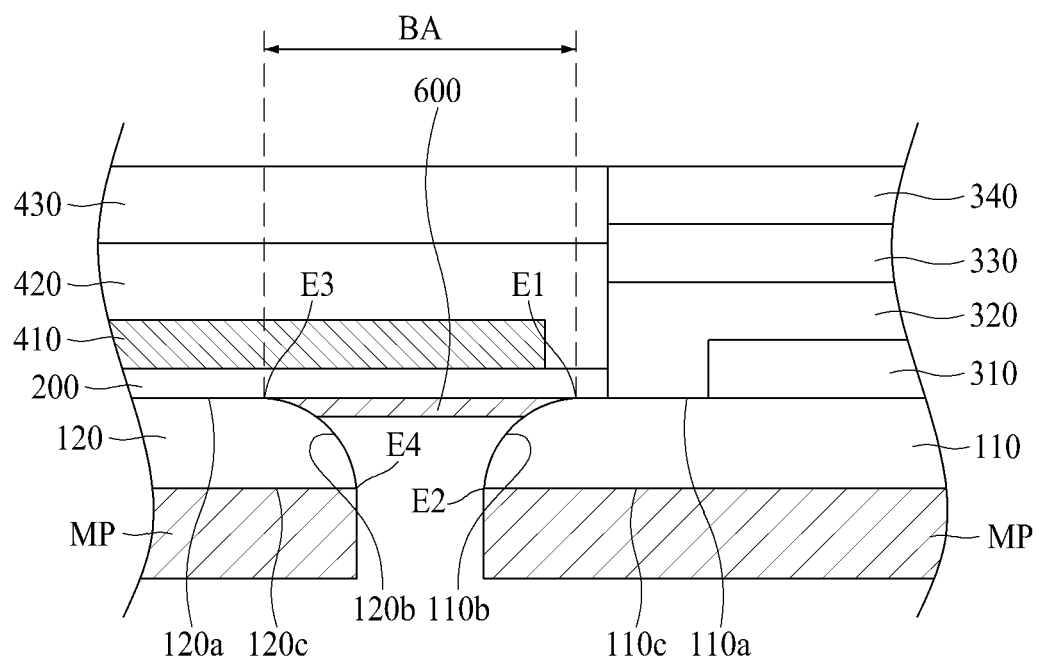

The flexible substrate 200 may be formed of a material having excellent resistance to an etching solution for glass etching described in FIGS. 8a to 8c while including a plastic material having flexibility. In this case, as the etching solution for etching the glass substrates 110 and 120, hydrofluoric acid HF or nitric acid $HNO_3$ may be used, or an etching solution which is known may be used.

The flexible substrate 200 may include any one of polyimide, photo acryl, polyurethane and silicone based organic matter, for example. More preferably, the flexible substrate 200 may include opaque or colored polyimide (PI). The flexible substrate 200 may be formed in an area overlapped with the first etching surface 110b of the first glass substrate 110, the second etching surface 120b of the second glass substrate 120 and the second flat surface 120a at a certain thickness and then hardened by a hardening process.

The display apparatus 10 according to one embodiment of the present disclosure may further comprise a pixel array layer 310, an overcoat layer 320, a touch sensor layer 330 and a functional film 340, which are sequentially formed on the first flat surface 110a of the first glass substrate 110 of the display area DA. Also, as shown in FIGS. 1 to 3, the flexible substrate 200 may be provided in the non-display area NDA which is not overlapped with the display area DA.

Also, as shown in FIG. 3, at least a portion of the flexible substrate 200 may be formed to overlap the flat area FA and the rear flat area RFA, which are adjacent to the bending area BA, as well as the bending area BA. If at least a portion of the flexible substrate 200 is formed to overlap the flat area FA and the rear flat area RFA, which are adjacent to the bending area BA, stability for the etching process of the first glass substrate 110 and the second glass substrate 120 may be improved, whereby reliability of the display apparatus 10 may be improved.

The pixel array layer 310 includes a plurality of pixels provided in a pixel area defined by pixel driving lines provided on the display area DA, displaying an image in accordance with a signal supplied to the pixel driving lines. In this case, the pixel driving lines may include data lines, gate lines and pixel driving power sources. Each of the pixels may include a pixel circuit layer, an anode electrode layer, a self-light emitting diode layer, and a cathode electrode layer.

The pixel circuit layer is provided in a transistor area of each pixel area and driven in accordance with a signal supplied from adjacent pixel driving lines to control light emission of the self-light emitting diode layer. The pixel circuit layer according to one example may include at least two thin film transistors that include a driving thin film transistor provided in the transistor area of each pixel area defined on the first glass substrate 110 and at least one capacitor. In this case, the pixel circuit layer may include at least one TFT of an amorphous thin film transistor (a-Si TFT), a polysilicon thin film transistor (poly-Si TFT), an oxide TFT, and an organic TFT. The anode electrode layer may electrically be connected with the driving thin film transistor.

The self-light emitting diode layer is formed on the anode electrode layer provided in an opening area of each pixel. In this case, the opening area of each pixel area may be defined by a bank pattern formed on an overcoat layer to cover the edges of the anode electrode layer.

The self-light emitting diode layer according to one example may include an organic light emitting diode, a quantum dot light emitting diode, or an inorganic light emitting diode. For example, the self-light emitting diode layer may be formed in a deposited structure of a hole injecting layer, a hole transporting layer, an organic light emitting layer, an electron transporting layer, and an electrode injecting layer, which are sequentially deposited. In this case, one or two or more of the hole injecting layer, the hole transporting layer, the electron transporting layer and the electron injecting layer may be omitted. The organic light emitting layer may be formed to emit light of the same color per pixel, for example, white light, or may be formed to emit light of different colors per pixel, for example, red light, green light, or blue light.

The cathode electrode layer is formed on the first glass substrate 110 to be commonly connected to the self-light emitting diode layer provided in each pixel area.

Also, the pixel array layer 310 may further include a pad portion and a gate driving circuit.

The pad portion may include a plurality of pad electrodes provided at an edge of at least one side of the first glass substrate 110. Each of the plurality of pad electrodes is electrically connected with the pixel driving lines provided in the pixel array layer 310 through each of a plurality of link lines, and is electrically connected with the gate driving circuit. The pad portion is electrically connected with the panel driving circuit 800 and supplies the signal supplied from the panel driving circuit 800 to the pixel driving lines and the gate driving circuit provided in the pixel array layer 310 through the link line portion 410.

The gate driving circuit 850 may be provided at left and/or right edges of the first glass substrate 110 to be connected with one end and/or the other end of each of the plurality of gate lines. The gate driving circuit generates a gate signal in response to a gate control signal supplied through the pad portion and supplies the generated gate signal to each of the plurality of gate lines. The gate driving circuit may be, but not limited to, a gate built-in circuit formed together with the manufacturing process of the thin film transistor of each pixel.

The overcoat layer 320 is formed on the first glass substrate 110 to surround the pixel array layer 310. The overcoat layer 320 may be formed to protect the pixel array layer 310 from external impact, and may serve to prevent oxygen and/or water and particles from being permeated into the pixel array layer 310. The overcoat layer 320 may be referred to as an encapsulation layer.

The overcoat layer 320 according to one example may include at least one inorganic film. The overcoat layer 320 may further include at least one organic film. For example, the overcoat layer 320 may include a first inorganic encapsulation layer, an organic encapsulation layer and a second inorganic encapsulation layer. The first and second inorganic encapsulation layers may include at least one inorganic material of silicon oxide SiOx, silicon nitride SiNx, silicon oxynitride SiON, titianium oxide TiOx and aluminium oxide AlOx. The organic encapsulation layer may be made of any one of organic material of acryl resin, epoxy resin, phenolic resin, polyamide resin, polyimide resin, and benzocyclobutene resin. The organic encapsulation layer may be expressed as a particle cover layer.

The touch sensor layer 330 may be provided on an upper surface of the overcoat layer 320. The touch sensor layer includes a mutual capacitance type or self-capacitance type touch sensor or touch electrode having a change of capacitance generated in accordance with a user's touch.

The touch sensor layer 330 according to one example may include a touch electrode layer arranged on the overcoat layer 320 overlapped with the pixel array layer 310, and a dielectric layer covering the touch electrode layer. Optionally, the touch sensor layer 330 may be formed on a touch buffer layer covering the overcoat layer 320. The touch electrode layer may include a plurality of touch driving electrodes arranged on the overcoat layer 320 overlapped with the pixel array layer 310 at constant intervals, and a plurality of touch sensing electrodes electrically insulated from the plurality of touch driving electrodes. The touch sensing electrodes may be arranged on the same layer as the touch driving electrodes or arranged on a layer different from the touch driving electrodes by interposing the dielectric layer.

The touch sensor layer 330 according to another example may be replaced with a touch panel of a capacitance type which is known. In this case, the touch panel may be attached on the overcoat layer 320 by a transparent adhesive member. In this case, the transparent adhesive member may include a pressure sensitive adhesive (PSA), an optically clear adhesive (OCA), or an optically clear resin (OCR).

Optionally, the touch sensor layer 330 may be arranged on the functional film 340. In this case, the functional film 340 may be arranged between the touch sensor layer 330 and the overcoat layer 320.

The functional film 340 is provided on the touch sensor layer 330 and improves optical characteristics of the display apparatus 10 by polarizing light emitted from each pixel of the pixel array layer 310 or preventing external light from being reflected. For example, the functional film 340 improves visibility and a contrast ratio of the display apparatus 10 by changing external light reflected by a thin film transistor and/or lines provided in each pixel to a circular polarizing state. For example, the functional film 340 according to one example may include a circular polarizer. Optionally, a polarizing layer may be formed in a film type that includes a circular polarizer and attached on the touch sensor layer by an adhesive.

As shown in FIG. 2, the first etching surface 110b of the first glass substrate 110 may be defined by the first end E1 of the first flat surface of the first glass substrate 110 and the end E2 of the first rear surface, and the second etching surface 120b of the second glass substrate 120 may be defined by the end E3 of the second flat surface of the second glass substrate 120 and the end E4 of the second rear surface. The first glass substrate 110 may include the first flat surface 110a, and the first etching surface 110b arranged at one side of the first flat surface 110a, and may further include the first rear surface 110c facing the first flat surface 110a.

The link line portion 410 may be, but limited to, one of a data link line and a gate link line.

According to one example, the link line portion 410 may be formed of a material having excellent flexibility and conductivity to reduce occurrence of a crack during bending of the bending area BA. For example, the link line portion 410 may be formed of the same conductive material as that of a source electrode or drain electrode of a thin film transistor constituting the pixel array layer 310 by the same process, but may be formed of another material without limitation to the above example.

A planarization layer 420 may prevent water permeation into the link lines from occurring while protecting the link lines of the link line portion 410 from external impact.

Also, the planarization layer 420 may substantially have a flat upper surface regardless of a pattern of the link line portion 410 arranged below the planarization layer 420. According to one example, the planarization layer 420 may be formed of the same material as that of a planarization layer formed after a transistor of the pixel array layer 310 is prepared.

For example, the planarization layer 420 may be formed of, but not limited to, any one or more materials of Acrylic Resin, Epoxy Resin, Phenolic Resin, Polyamides Resin, Polyimides Resin, Unsaturated Polyesters Resin, Polyphenylene Resin, Polyphenylenesulfides Resin, and Benzocyclobutene.

A micro coating layer 430 may serve to protect a line by forming a resin in a bending position at a thin thickness because a crack may occur due to a tensile force acting on the link line portion 410 arranged on the flexible substrate 200 during bending. The micro coating layer 430 may be made of an acryl based material such as acrylate polymer.

The micro coating layer 430 may control a neutral plane of the bending area BA. The neutral plane may mean a virtual plane to which a stress is not applied as a compressive force and a tensile force applied to a structure are counterbalanced when the structure is bent. If two or more structures are deposited, a virtual neutral plane may be formed between the structures. If the structures are bent in one direction, the structures arranged in a bending direction based on the neutral plane are compressed by bending, whereby a compressive force is applied to the structures. On the contrary, the structures arranged in an opposite direction of the bending direction based on the neutral plane are stretched by bending, whereby a tensile force is applied to the structures. Since the structures are more vulnerable to the tensile force than the compressive force, it is likely that a crack may occur when the tensile force is applied to the structures.

Since the flexible substrate 200 arranged at a lower portion based on the neutral plane is compressed, the compressive force may be applied to the flexible substrate 200, and the tensile force may be applied to the link line portion 410 arranged at an upper portion, whereby a crack may occur due to the tensile force. Therefore, the micro coating layer 600 may be arranged on the neutral plane to minimize the tensile force applied to the link line portion 410.

The micro coating layer 430 may be arranged on the bending area BA to ascend the neutral plane in an up direction, and the neutral plane may be formed at the same position as the line or the line may be arranged to be higher than the neutral plane, whereby a stress may not be applied or a compressive force may be applied during bending to reduce occurrence of a crack.

The panel driving circuit 800 may be packaged in the second glass substrate 120 to supply a signal for displaying an image to the pixel array layer 310. The panel driving circuit 800 according to one example may include a flexible circuit film 830 and a driving integrated circuit 810. The flexible circuit film 830 may be attached to one side of the first glass substrate 120 through a film attachment process.

The driving integrated circuit 810 is packaged in the flexible circuit film 830 by a chip bonding process or a surface packaging process. The driving integrated circuit 810 generates a data signal and a gate control signal based on a timing synchronizing signal and image data supplied from an external display driving system, supplies the data signal to the data line of each pixel and supplies the gate control signal to the gate driving circuit.

Optionally, the driving integrated circuit 810 may electrically be connected to the pad portion by being packaged in the second glass substrate 120 without being packaged in the flexible circuit film 830, and may electrically be connected to each of the pixel driving signal line and the gate driving circuit. In this case, the flexible circuit film 830 serves to relay signal transmission between the pad portion and the display driving system.

In the display apparatus 10 according to one embodiment of the present disclosure, the pixel array layer 310 is directly formed on the first flat surface 110a of the first glass substrate 110 without a separate member. The flexible substrate 200 may not arranged on the first flat surface 110a, and the pixel array layer 310 may directly be formed on the first glass substrate 110. Therefore, in the display apparatus 10 according to one embodiment of the present disclosure, since the display area DA does not require a sacrificial layer, an inter-layer dielectric layer or a buffer layer, which is arranged below the thin film transistor, the process is simplified and the cost is reduced.

Figure 4:
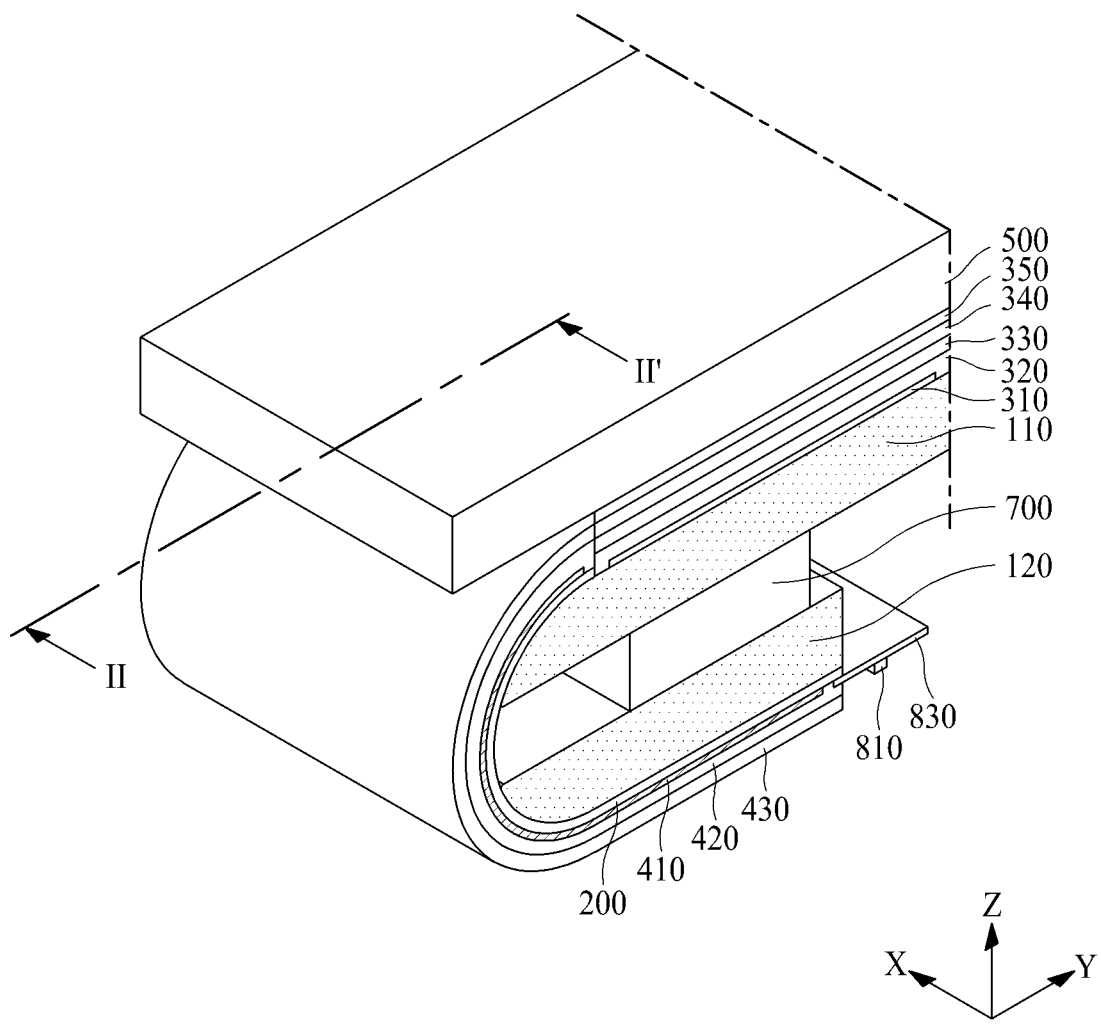
FIG. 4 is a perspective view illustrating a display apparatus according to one embodiment of the present disclosure.
Figure 5:
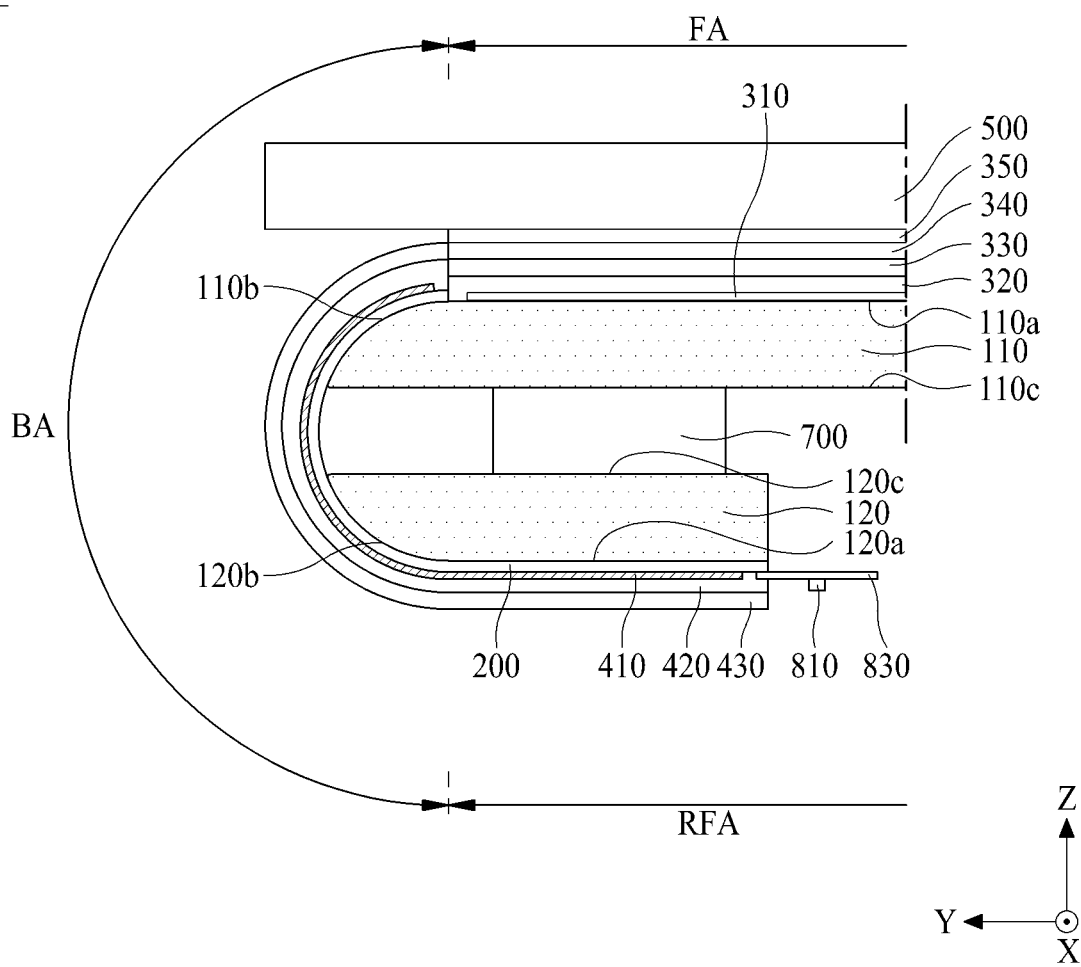
FIG. 5 is a cross-sectional view taken along line II-IF shown in FIG. 4.

FIG. 4 is a perspective view illustrating a display apparatus according to one embodiment of the present disclosure, and FIG. 5 is a cross-sectional view taken along line II-IF shown in FIG. 4.

As shown in FIGS. 4 and 5, the second glass substrate 120 may be bent toward an inner side of the display apparatus 10 at 180°, and may be bent such that the second rear surface 120c of the second glass substrate 120 faces the first rear surface 110c of the first glass substrate 110. Also, the adhesive member 800 for fixing the second rear surface 120c of the second glass substrate 120 to the first rear surface 110c of the first glass substrate 110 may further be arranged between the second rear surface 120c of the second glass substrate 120 and the first rear surface 110c of the first glass substrate 110.

As the flexible substrate 200 is arranged to be bent on the first etching surface 110b on the first glass substrate 110 and the second etching surface 112b on the second glass substrate 120 by a glass etching process in a curved shape, the flexible display apparatus 10 according to one embodiment of the present disclosure may have a minimized bezel area. In more detail, as the first rear surface 110c of the first glass substrate 110 and the second rear surface 120c of the second glass substrate 120 are not arranged on the same line unlike the conventional display apparatus, the second rear surface 120c of the second glass substrate 120 has a bending structure to face the first rear surface 110c of the first glass substrate 110, whereby the display apparatus 10 in which the non-display area NDA is minimized may be provided.

The first etching surface 110b of the first glass substrate 110 and the second etching surface 120b of the second glass substrate 120 according to one embodiment of the present disclosure may be formed by a glass etching process based on over etch condition. In this case, the over etch condition may be defined by a glass etching process performed for a reference etching time or more, which is set to etch a glass of a certain thickness.

The first etching surface 110b of the first glass substrate 110 and the second etching surface 120b of the second glass substrate 120 may be formed in such a manner that a mask pattern is formed on a rear surface of a glass substrate (not shown) overlapped with the other areas FA and RFA except the bending area BA and then an area of the glass substrate overlapped with the bending area BA is etched in an oblique shape by the glass etching process using the mask pattern as a mask based on the over etch condition. In this case, the glass substrate (not shown) means a glass substrate before the first glass substrate 110 and the second glass substrate 120 are detached from each other by the glass etching process.

The first etching surface 110b of the first glass substrate 110 and the second etching surface 120b of the second glass substrate 120 may be formed as inclined surfaces having a convex curved shape. In this case, cross sectional areas of the first etching surface 110b of the first glass substrate 110 and the second etching surface 120b of the second glass substrate 120 may be increased as these etching surfaces become far away from the first flat surface 110a and the second flat surface 120a. For example, the cross sectional areas of the first etching surface 110b of the first glass substrate 110 and the second etching surface 120b of the second glass substrate 120 may be defined by a size of a horizontal cutting surface cut based on a horizontal surface parallel with the first flat surface 110a and the second flat surface 120a. The first etching surface 110b and the second etching surface 120b may be designated to have an inverse tapered shape.

The display apparatus 10 according to one embodiment of the present disclosure may further comprise an adhesive layer 350 arranged on the functional film 340 and a cover window 500 provided on the adhesive layer 350.

The adhesive layer 350 may include a pressure-sensitive adhesive, a foam-type adhesive, a liquid adhesive, a light-cured adhesive or another suitable adhesive material. In some embodiments, the adhesive layer 350 may be formed of a compressive material or include the compressive material and therefore may serve as a buffer member for a portion adhered by the adhesive layer 350. For example, the material of the adhesive layer 350 may be compressed. The adhesive layer 350 may be formed in a multi-layered structure that includes a buffer layer arranged between the upper and lower layers of the adhesive material layer.

The cover window 500 may be arranged to cover a front surface of the display apparatus 10 and the bending area BA, and may serve to protect the display apparatus 10 from external impact. The cover window 500 according to one example may be made of a transparent material, a glass material or a reinforcing glass material.

Also, the display apparatus 10 may further comprise an adhesive member 700 for fixing the first rear surface 110c of the first glass substrate 110 to the second rear surface 120c of the second glass substrate 120, but the adhesive member 700 may be omitted depending on a design of the display apparatus 10. The adhesive member 700 may be, but not limited to, an optically clear adhesive (OCA), an optically clear resin (OCR), a pressure sensitive adhesive (PSA), a double side adhesive, or a double side tape.

As shown in FIGS. 4 and 5, according to one embodiment of the present disclosure, the first etching surface 110b of the first glass substrate 110 and the second etching surface 120b of the second glass substrate 120, which are overlapped with the bending area BA, may be provided to be directly in contact with the flexible substrate 200. At this time, since the first etching surface 110b of the first glass substrate 110 and the second etching surface 120b of the second glass substrate 120 may guide bending of the flexible substrate 200 and the link line portion 410 of the bending area, these etching surfaces may be referred to as bending guide portions.

As the first etching surface 110b and the second etching surface 120b according to one embodiment of the present disclosure are respectively formed by the glass etching process at the same time, these etching surfaces may have the same shape within an etching process error range. For example, if the first etching surface 110b and the second etching surface 120b are formed in a streamlined shape, these etching surfaces may have the same curvature, if the first etching surface 110b and the second etching surface 120b are formed in an oblique shape, these etching surfaces may have the same inclination, or if the first etching surface 110b and the second etching surface 120b are formed in a stair shape, these etching surfaces may be formed in a stair shape having the same step difference.

Figure 6A:
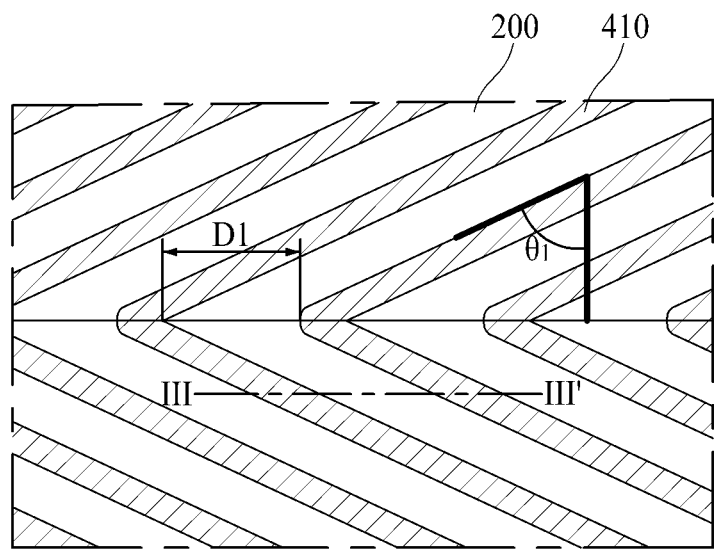
FIG. 6a is a brief plane view illustrating a link line portion arranged on a flexible substrate.
Figure 6B:
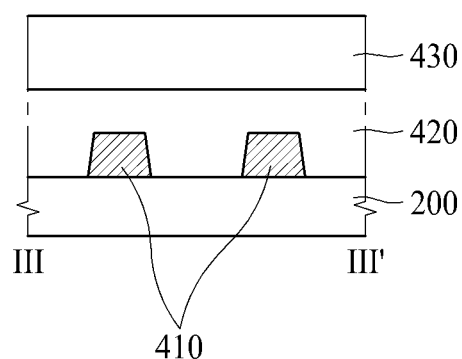

FIG. 6a is a brief plane view illustrating a link line portion arranged on a flexible substrate, and FIG. 6b is a cross-sectional view taken along line shown in FIG. 6a.

FIG. 6a is a brief plane view illustrating the link line portion 410 arranged on the flexible substrate 200, and a glass substrate, a planarization layer 420 and a micro coating layer 430 are omitted for convenience of description. In FIG. 6a, the link line portion 410 may be a circuit line connected to the data line of the pixel or the gate driving circuit 850. The link line portion 410 of FIG. 6a may be arranged in the non-display area NDA, and may be arranged to overlap the flexible substrate 200 and the bending area BA.

As shown in FIG. 6a, at least a portion of the link line portion 410 arranged to include the bending area BA is formed to be extended to an oblique direction different from a bending direction, whereby a tensile force may be minimized to reduce occurrence of a crack. A shape of the line may be provided in, but not limited to, a rhombus shape, a triangle wave shape, a sine wave shape, a trapezoidal shape, etc.

At this time, a distance D1 between patterns of the link line portion 410 may be set to a distance of 10 μm to 30 μm, and an angle θ1 between the link line portion 410 and a vertical line may be set to an angle of 60° to 80°. However, the embodiment of the present disclosure is not limited to this example. The pattern of the link line portion 410 of FIG. 6a is formed in an area corresponding to the bending area BA, whereby a stress generated during bending of the bending area BA may be dispersed.

Referring to FIG. 6b, a plurality of link line portions 410 may be arranged on the flexible substrate 200, and may be covered by the planarization layer 420 and the micro coating layer 430.

The planarization layer 420 may be formed of, but not limited to, any one or more materials of Acrylic Resin, Epoxy Resin, Phenolic Resin, Polyamides Resin, Polyimides Resin, Unsaturated Polyesters Resin, Polyphenylene Resin, Polyphenylenesulfides Resin, and Benzocyclobutene.

The micro coating layer 430 may serve to protect the line by coating a resin in a bending position at a thin thickness because a crack may occur due to a tensile force acting on the link line portion 410 arranged on the flexible substrate 200 during bending. The micro coating layer 430 may be made of an acryl based material such as acrylate polymer.

Figure 7A:
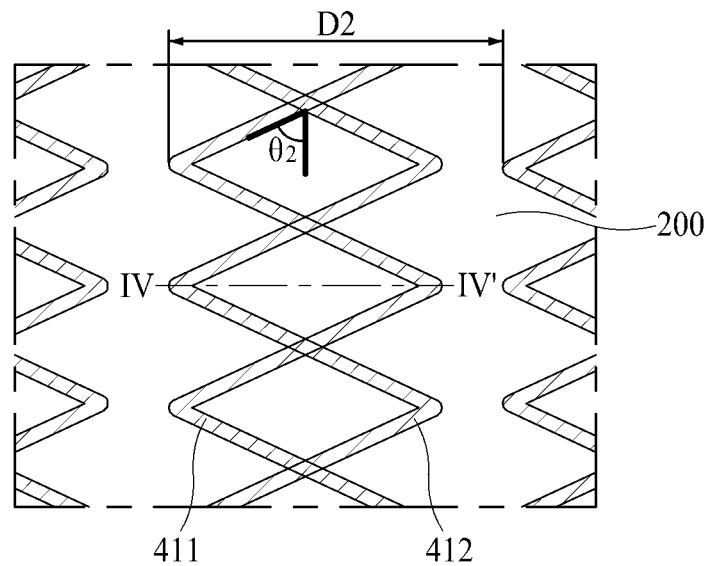
FIG. 7a is a brief plane view illustrating a link line portion arranged on a flexible substrate.
Figure 7B:
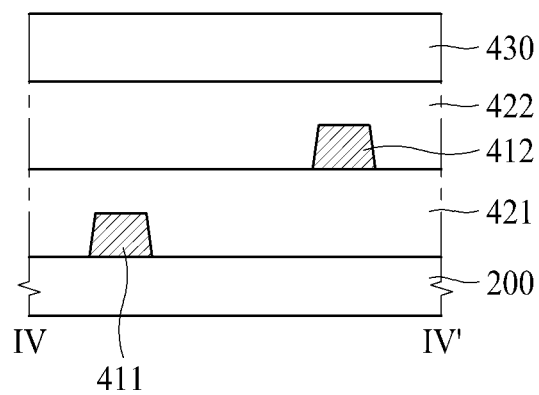

FIG. 7a is a brief plane view illustrating a link line portion arranged on a flexible substrate, and FIG. 7b is a cross-sectional view taken along line IV-IV' shown in FIG. 7a.

FIG. 7a is a brief plane view illustrating the link line portion 410 arranged on the flexible substrate 200, and a glass substrate, a planarization layer 420 and a micro coating layer 430 are omitted for convenience of description. In FIG. 7a, the link line portions 410 and 412 may be power lines VDLSS and VDLDD for driving the pixel of the pixel array layer 310. The link line portions 411 and 412 of FIG. 7a may be arranged in the non-display area NDA, and may be arranged to overlap the flexible substrate 200 and the bending area BA. If the link line portions 411 and 412 are arranged to overlap the bending area BA, a stress or tensile stress may be applied to the link line portions due to bending, whereby disconnection caused by a crack may be generated.

As shown in FIG. 7a, at least a portion of the link line portions 411 and 412 arranged to include the bending area BA may be formed in a rhombus shape that includes an oblique direction different from a bending direction, whereby a tensile force may be minimized to reduce occurrence of a crack. A shape of the line may be provided in, but not limited to, a triangle wave shape, a sine wave shape, a trapezoidal shape, etc.

At this time, a distance D1 between patterns of the link line portions 411 and 412 may be set to a distance of 50 μm to 70 μm, and an angle θ1 between the link line portions 411 and 412 and a vertical line may be set to an angle of 60° to 80°. However, the embodiment of the present disclosure is not limited to this example. The pattern of the link line portions 411 and 412 of FIG. 7a is formed in an area corresponding to the bending area BA, whereby a stress generated during bending of the bending area BA may be dispersed.

Referring to FIG. 7b, one 411 of the link line portions 411 and 412 may be arranged on the flexible substrate 200, and the other one 412 may be arranged on a first planarization layer 421. As shown in FIG. 7b, the link line portions 411 and 412 may be formed to be arranged on their respective layers different from each other. Also, the link line portion 412 arranged on the first planarization layer 421 may be covered by a second planarization layer 422.

FIGS. 8a to 8c are cross-sectional views illustrating a manufacturing method of a first etching surface of a first glass substrate and a second etching surface of a second glass substrate in a display apparatus according to the present disclosure.

First of all, referring to FIG. 8a, a flexible film 200 is formed on an upper surface corresponding to the bending area BA of the glass substrate 100, and a pixel portion that includes a pixel array layer 310, a first overcoat layer 320, a touch sensor layer 330 and a functional film 340 is formed on an upper surface corresponding to the display area DA of the glass substrate 100. Afterward, a glass etching mask pattern MP is formed on a rear surface of the glass substrate 100 except a preset glass etching area. In this case, the glass etching mask pattern MP may include an open portion OP corresponding to the bending area BA of the display apparatus 10.

Next, as shown in FIG. 8b, a portion overlapped with the open portion OP of the glass etching mask pattern MP of the glass substrate 100 is removed by etching through a glass etching process using the glass etching mask pattern MP as a mask, whereby the glass substrate 100 is divided into the first glass substrate 110 supporting the display area DA and the second glass substrate 120 supporting the non-display area NDA. The first etching surface 110b of the first glass substrate and the second etching surface 120b of the second glass substrate 120, which are overlapped with the bending area BA of the display apparatus 10, are formed. In this case, the glass etching process may be performed by a wet etching process, not a dry etching process.

Also, the first end E1 of the first flat surface 110a of the first glass substrate 110, the second end E2 of the first rear surface, the third end E3 of the second flat surface 120a of the second glass substrate 120 and the fourth end E4 of the second rear surface may be defined by the etching process of the glass substrate. If the second glass substrate 120 of the display apparatus 10 according to one embodiment of the present disclosure is bent, the second end E2 and the fourth end E4 may adjoin each other, and an area between the end E1 of the first flat surface of the first glass substrate 110 and the end E3 of the first flat surface of the second glass substrate 120 may be defined as the bending area BA.

The first etching surface 110b of the first glass substrate 110 and the second etching surface 120b of the second glass substrate 120 may serve to guide bending of the flexible substrate 200 corresponding to the bending area BA in a curved shape. Therefore, the glass etching process according to the present disclosure may be performed by an over etch condition to form the first etching surface 110b and the second etching surface 120b, which have a convex sectional shape. In this case, the over etch condition may be defined by a glass etching process performed by exceeding a reference etching time that may etch the glass substrate of a certain thickness. If the glass etching process based on the over etch condition is performed, over etching occurs from the rear surfaces 110c and 120c of the first glass substrate 110 and the second glass substrate 120 to the flat surfaces 110a and 120a of the first glass substrate 110 and the second glass substrate 120 adjacent to the rear surface of the flexible substrate 200 in accordance with the passage of the etching time, whereby undercut UC may occur between the rear surface of the flexible substrate 200 and the flat surfaces 110a and 120a of the first glass substrate 110 and the second glass substrate 120 and as a result the first etching surface 110b of the first glass substrate 110 and the second etching surface 120b of the second glass substrate 120 may have an inverse tapered shape. In this case, undercut UC may be formed as the first glass substrate 110 and the second glass substrate 120 adjacent to the flexible substrate 200 are partially over etched in accordance with the etching process time performed to exceed the reference etching time.

Next, referring to FIG. 8c, an elastic member 600 may selectively be arranged in an area exposed to the lower portion of the flexible substrate 200 overlapped with the bending area BA by glass etching. The elastic member 600 may buffer bending of the bending area BA if the bending area BA is bent, and may serve to prevent water from being permeated into a space between the first glass substrate 110 and the second glass substrate 120.

According to one embodiment of the present disclosure, a moisture proofing insulating member having a moisture-proofing characteristic may be used as the elastic member 600, and the elastic member 600 may be an epoxy based resin. A moisture proofing insulating member known as tuffy may be used as the elastic member 600.

A material having an excellent moistureproofing characteristic may be used as the elastic member 600, for example, a material such as tuffy may be used as the elastic member 600. The elastic member 600 may be applied to be deposited on the rear surface of the flexible substrate 200, and may be formed to overlap the bending area BA.

The elastic member 600 may be filled (or buried) to overlap the first etching surface 110b of the first glass substrate 110, the second etching surface 120b of the second glass substrate 120 and the flexible substrate 200. The elastic member 600 may shield water or oxygen from being permeated into the display apparatus 10 through the flexible substrate 200 adjacent to the first etching surface 110b of the first glass substrate 110 and the second etching surface 120b of the second glass substrate 120. Also, the elastic member 600 may prevent the flexible substrate 200 adjacent to the first etching surface 110b of the first glass substrate 110 and the second etching surface 120b of the second glass substrate 120 from being damaged during repeated bending (or folding) of the display apparatus 10.

Since the elastic member 600 is formed to overlap the flexible substrate 200 and the first etching surface 110b of the first glass substrate 110 and the second etching surface 120b of the second glass substrate 120 overlapped with the bending area BA of the display apparatus 10, a shape based on a width and thickness of the elastic member 600 may be set based on a position of the neutral plane based on a compressive stress and tensile stress applied to the bending area BA of the display apparatus 10 during bending (or folding) of the bending area BA of the display apparatus 10.

The elastic member 600 according to one example may be formed in such a manner that a liquid resin, for example, organic resin is filled (or buried) in the flexible substrate 200 and the first etching surface 110b of the first glass substrate 110 and the second etching surface 120b of the second glass substrate through a jetting process or dispensing process and then hardened by photo-hardening process.

As the elastic member 600 is made of a liquid resin, the elastic member 600 may be filled (or permeated) into a gap between the flexible substrate 200 and the glass substrate 110 adjacent to the first etching surface 110b of the first glass substrate 110 and the second etching surface 120b of the second glass substrate 120. To this end, the elastic member 600 may include a material having a moistureproofing characteristic while having an adhesive characteristic, and may include an optical bond hardened by UV. For example, the elastic member 600 may include an acryl based or silicone based organic adhesive material. The elastic member 600 may have an elongation rate of 100% or more.

Also, the elastic member 600 according to one example may have predetermined adhesive characteristic while having an elongation rate of 100% or more. Therefore, if the second rear surface 120c of the second glass substrate 120 is bent toward the first rear surface 110c of the first glass substrate 110, a bending state of the first rear surface 110c and the second rear surface 120c may be fixed.

Figure 9A:
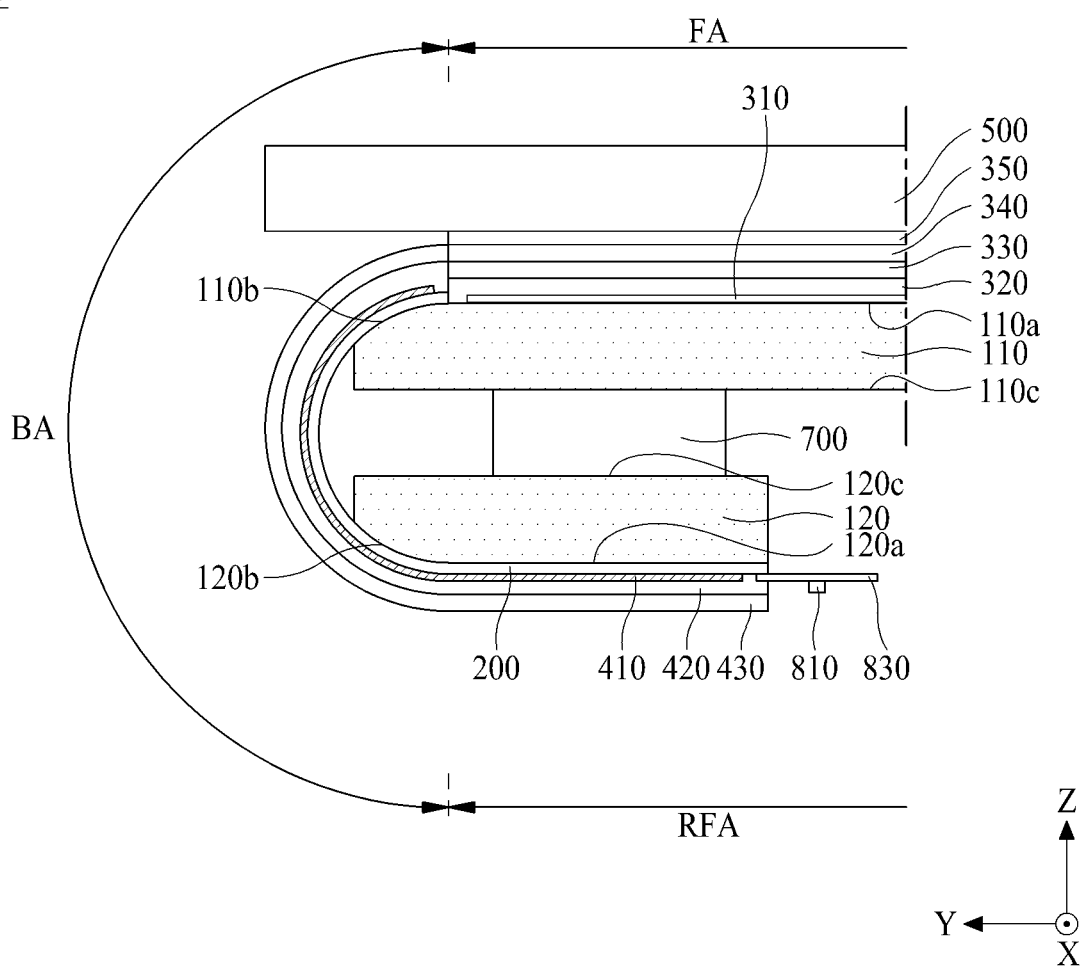
FIGS. 9a and 9b are another example of a sectional view taken along line II-II'.
Figure 9B:
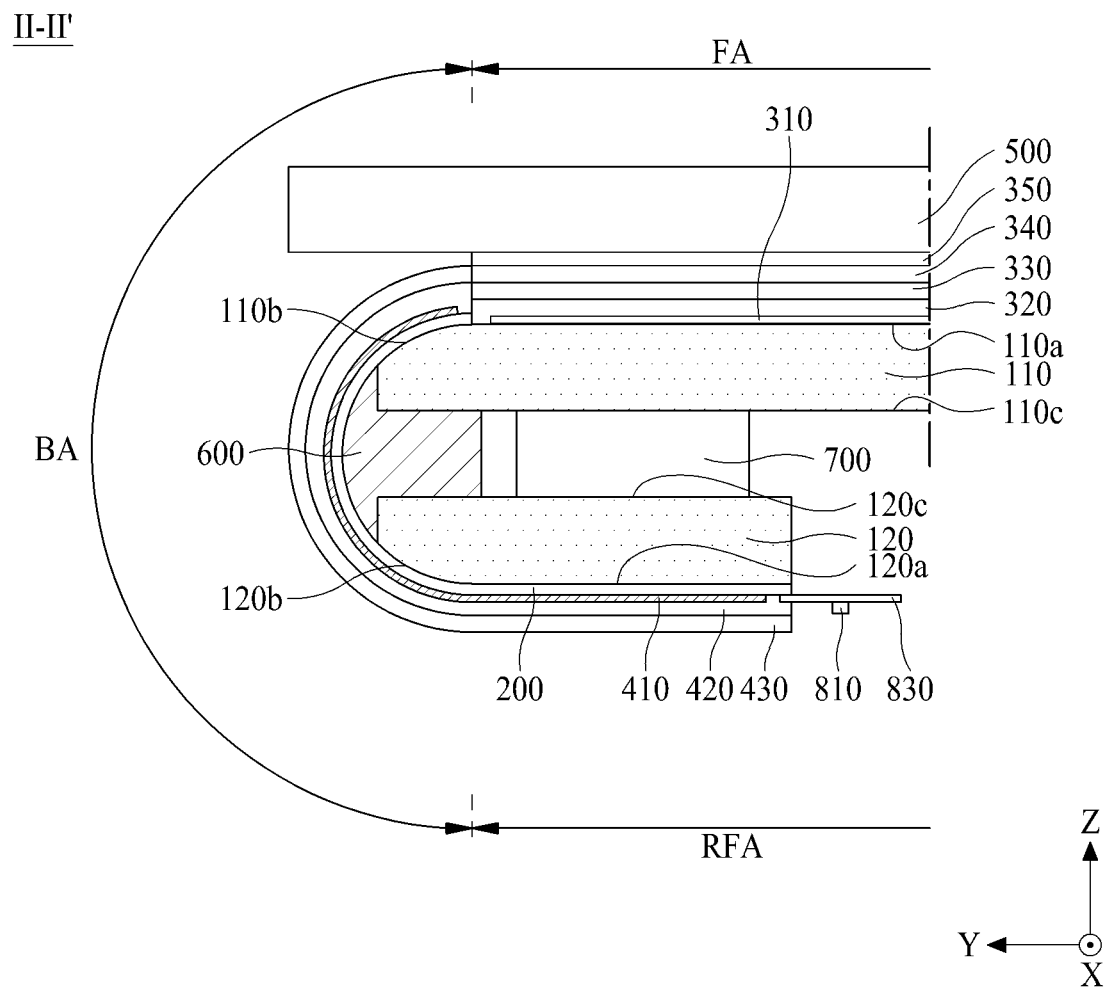

FIGS. 9a and 9b are another example of a sectional view taken along line II-II'.

Referring to FIGS. 9a, at least a portion of the first etching surface 110b of the first glass substrate 110 and the second etching surface 120b of the second glass substrate 120 has an inverse tapered shape or undercut UC structure, and may include a vertical etching surface substantially parallel with a third direction Z.

Therefore, the display apparatus 10 shown in FIG. 9a may be provided such that at least a portion of the first etching surface 110b of the first glass substrate 110 and the second etching surface 120b of the second glass substrate 120 is in contact with the flexible substrate 200 and at least a portion of the first etching surface 110b of the first glass substrate 110 and the second etching surface 120b of the second glass substrate 120 is not in contact with the flexible substrate 200. Therefore, in the display apparatus 10 of FIG. 9a, the flexible substrate 200, the link line portion 410 and the micro coating layer 430, which are overlapped with the bending area BA, may be spaced apart from one another at a predetermined distance to have a degree of freedom.

As shown in a sectional view of FIG. 9b, if at least a portion of the first etching surface 110b of the first glass substrate 110 and the second etching surface 120b of the second glass substrate 120 is not in contact with the flexible substrate 200, the elastic member 600 may additionally be provided below the flexible substrate 200. Therefore, as the elastic member 600 is additionally provided below the flexible substrate 200, the elastic member 600 may support the flexible substrate 200 overlapped with the bending area BA. In this case, the elastic member 600 may be used as the term such as a moistureproofing member, a filling member or an elongation member. The elastic member 600 may be arranged on the rear surface of the flexible substrate 200 overlapped with the bending area BA. Also, although FIG. 9b shows that the elastic member 600 is not deposited between the first and second etching surfaces 110b and 120b and the flexible substrate 200, the elastic member 600 may be provided to fill a fine gap between the first and second etching surfaces 110b and 120b and the flexible substrate 200.

FIGS. 10a to 10d are other example of a sectional view taken along line II-II'.

Referring to FIGS. 10a to 10d, the first etching surface 110b of the first glass substrate 110 and the second etching surface 120b of the second glass substrate 120 may have a forward tapered shape and a curved surface, and may be provided not to be in contact with the flexible substrate 200.

The first etching surface 110b of the first glass substrate 110 and the second etching surface 120b of the second glass substrate 120 according to one embodiment of the present disclosure may be formed by a glass etching process according to a soft etch condition. In this case, the soft etch condition may be defined by a glass etching process performed for less time than a reference etching time set to etch a glass of a certain thickness.

The first etching surface 110b of the first glass substrate 110 and the second etching surface 120b of the second glass substrate 120 may be formed in such a manner that a mask pattern is formed on a rear surface of a glass substrate (not shown) overlapped with the other areas FA and RFA except the bending area BA and then an area of the glass substrate overlapped with the bending area BA is etched in an oblique shape by the glass etching process using the mask pattern as a mask based on the soft etch condition. In this case, the glass substrate (not shown) means a glass substrate before the first glass substrate 110 and the second glass substrate 120 are detached from each other by the glass etching process.

The first etching surface 110b of the first glass substrate 110 and the second etching surface 120b of the second glass substrate 120 may be formed as inclined surfaces having a convex curved shape or linear shape. In this case, sectional areas of the first etching surface 110b of the first glass substrate 110 and the second etching surface 120b of the second glass substrate 120 may be reduced as these etching surfaces become far away from the first flat surface 110a and the second flat surface 120a. For example, the sectional areas of the first etching surface 110b of the first glass substrate 110 and the second etching surface 120b of the second glass substrate 120 may be defined by a size of a horizontal cutting surface cut based on a horizontal surface parallel with the first flat surface 110a and the second flat surface 120a. The first etching surface 110b and the second etching surface 120b may be designated to have a forward tapered shape.

Figure 10A:
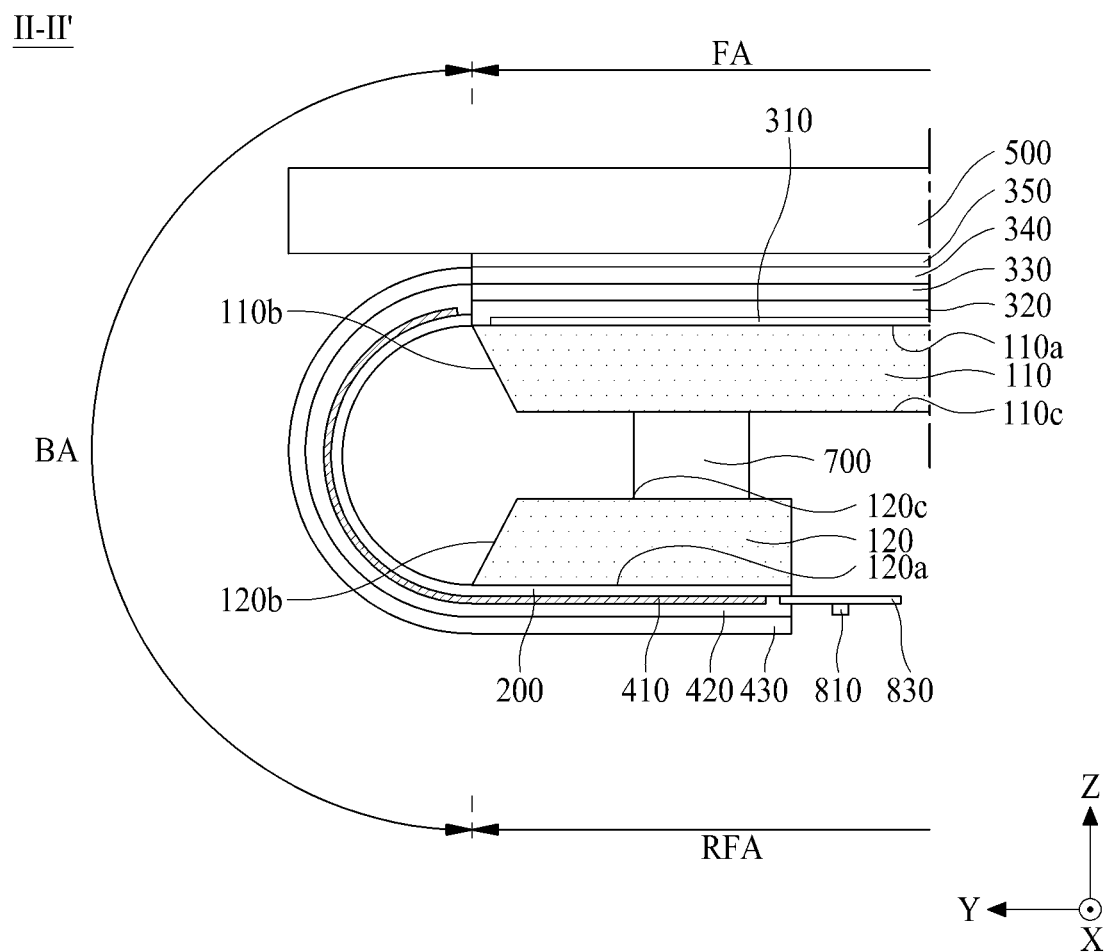
FIGS. 10a to 10d are other example of a sectional view taken along line II-II'.
Figure 10B:
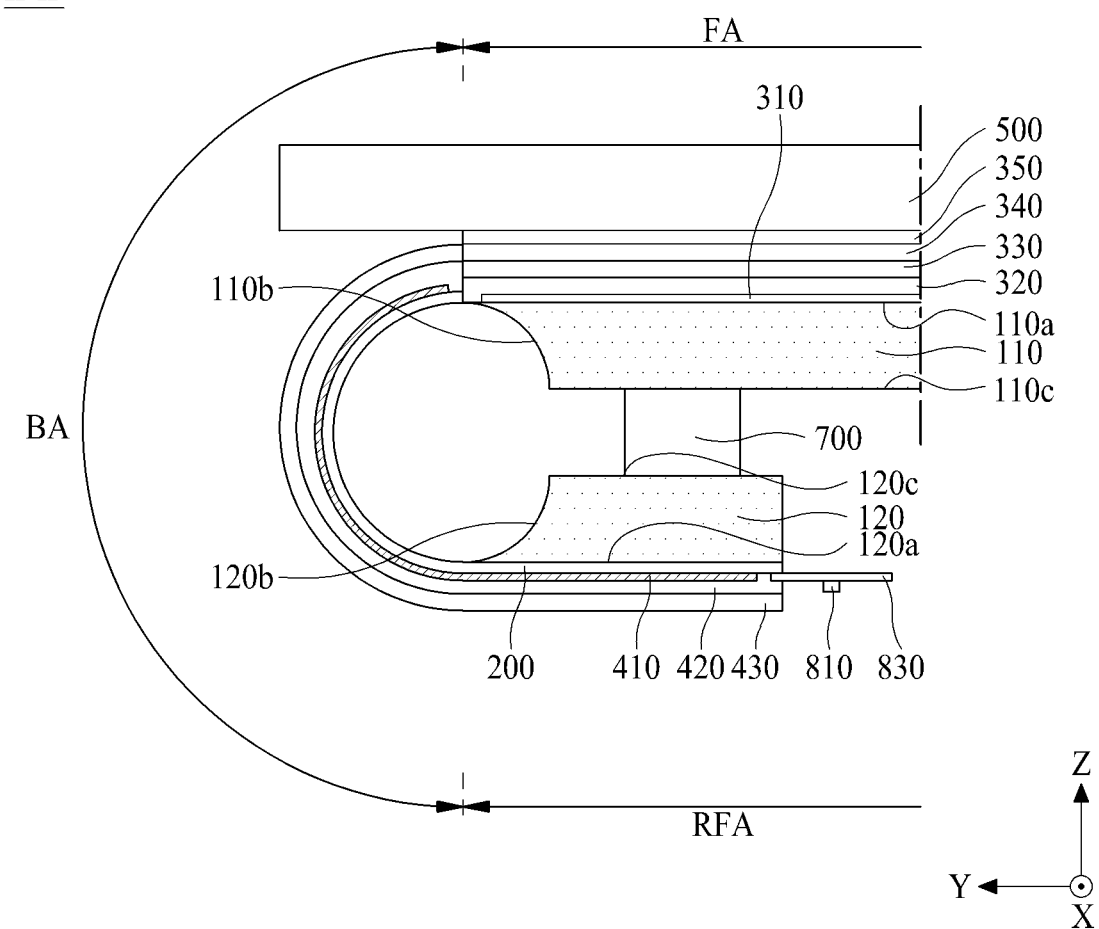
Figure 10C:
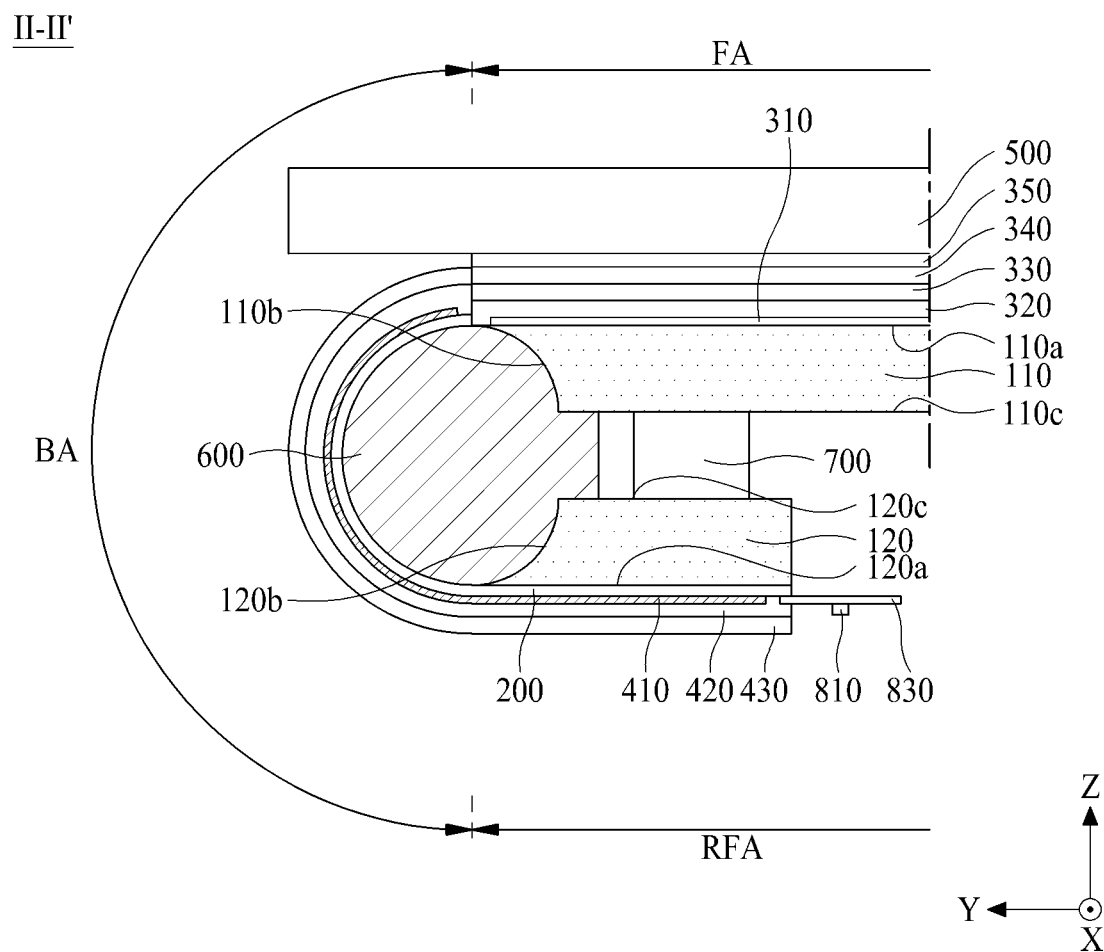

As shown in FIGS. 10a to 10c, the first etching surface 110b of the first glass substrate 110 and the second etching surface 120b of the second glass substrate 120 according to one embodiment of the present disclosure may have a forward tapered structure, and therefore may not be in contact with the flexible substrate 200. Also, as shown in FIG. 10c, the display apparatus 10 may further comprise an elastic member 600 provided below the flexible substrate 200.

Figure 10D:
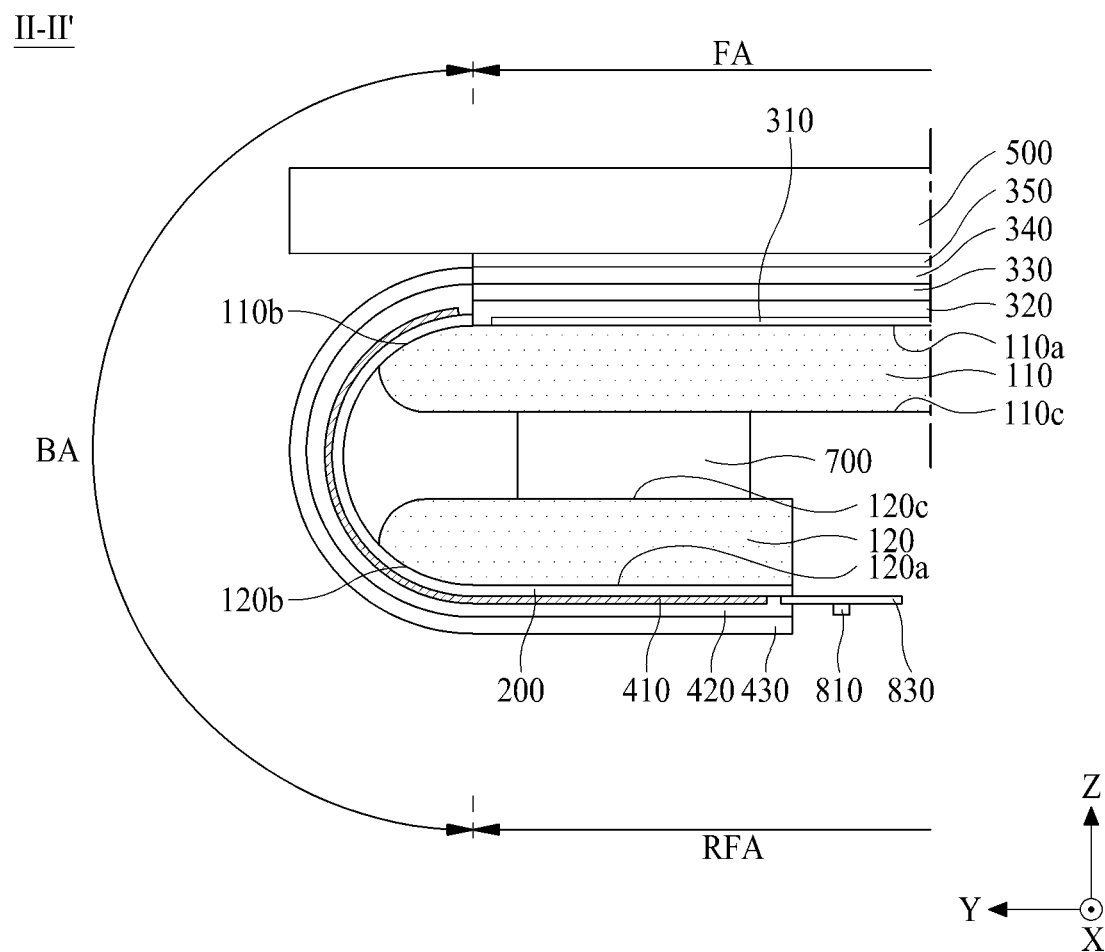

Referring to FIG. 10d, the first etching surface 110b of the first glass substrate 110 and the second etching surface 120b of the second glass substrate 120 may have rounded-edge ends or stumpy ends which are not sharp. The structure of the first etching surface 110b of the first glass substrate 110 and the second etching surface 120b of the second glass substrate 120 having rounded-edge ends or stumpy ends may be a structure that a stress is slowly dispersed when supporting the flexible substrate 200, whereby reliability of the display apparatus 10 may be improved. Also, although FIG. 10d shows that the elastic member 600 is not deposited between the first and second etching surfaces 110b and 120b and the flexible substrate 200, the elastic member 600 may be provided to fill a fine gap between the first and second etching surfaces 110b and 120b and the flexible substrate 200.

As the display apparatus 10 according to one embodiment of the present disclosure provides a structure that the flexible substrate 200 is not arranged in the display area DA, luminance or residual image characteristics caused by the flexible substrate 200, which may occur in the display area DA, may be improved, whereby a defect rate may be reduced and yield may be improved.

Figure 11:
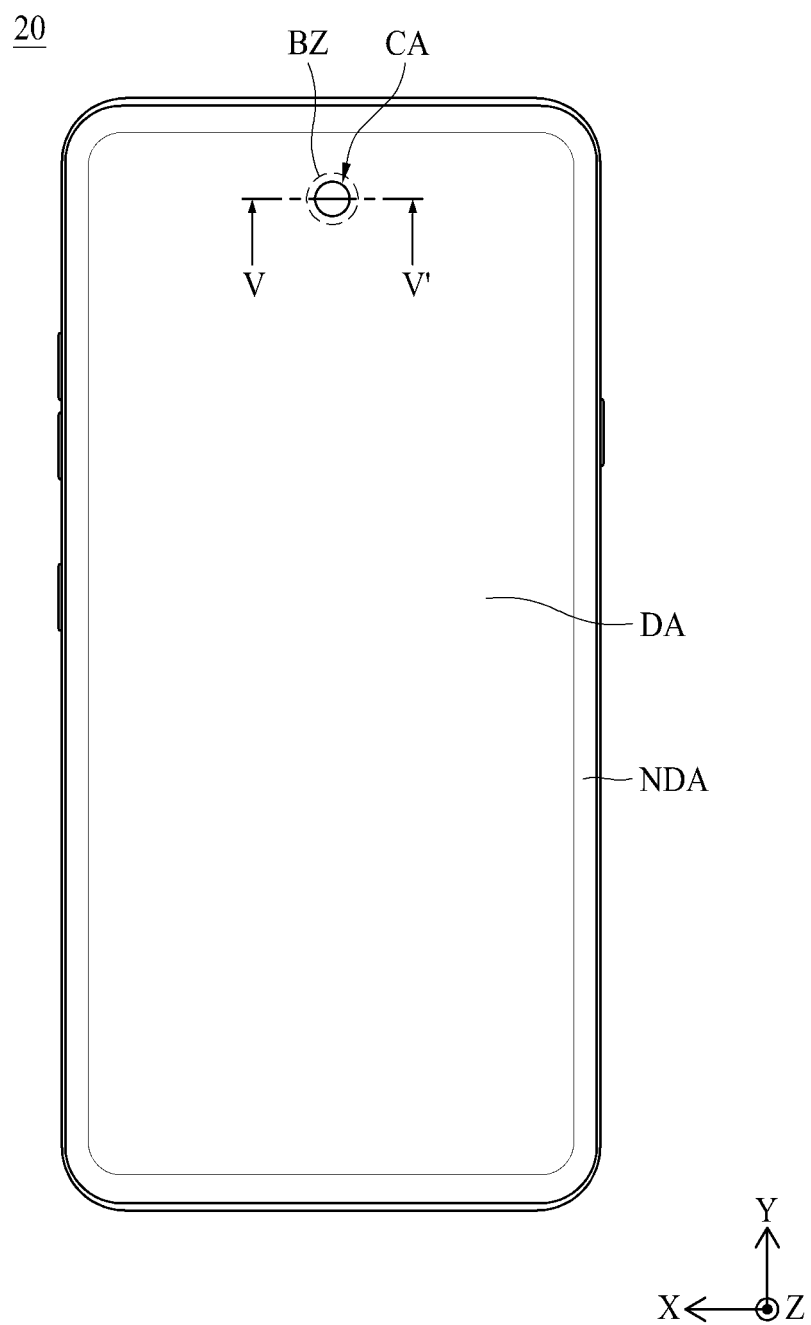
FIG. 11 is a plane view illustrating a display apparatus according to one embodiment of the present disclosure.
Figure 12:
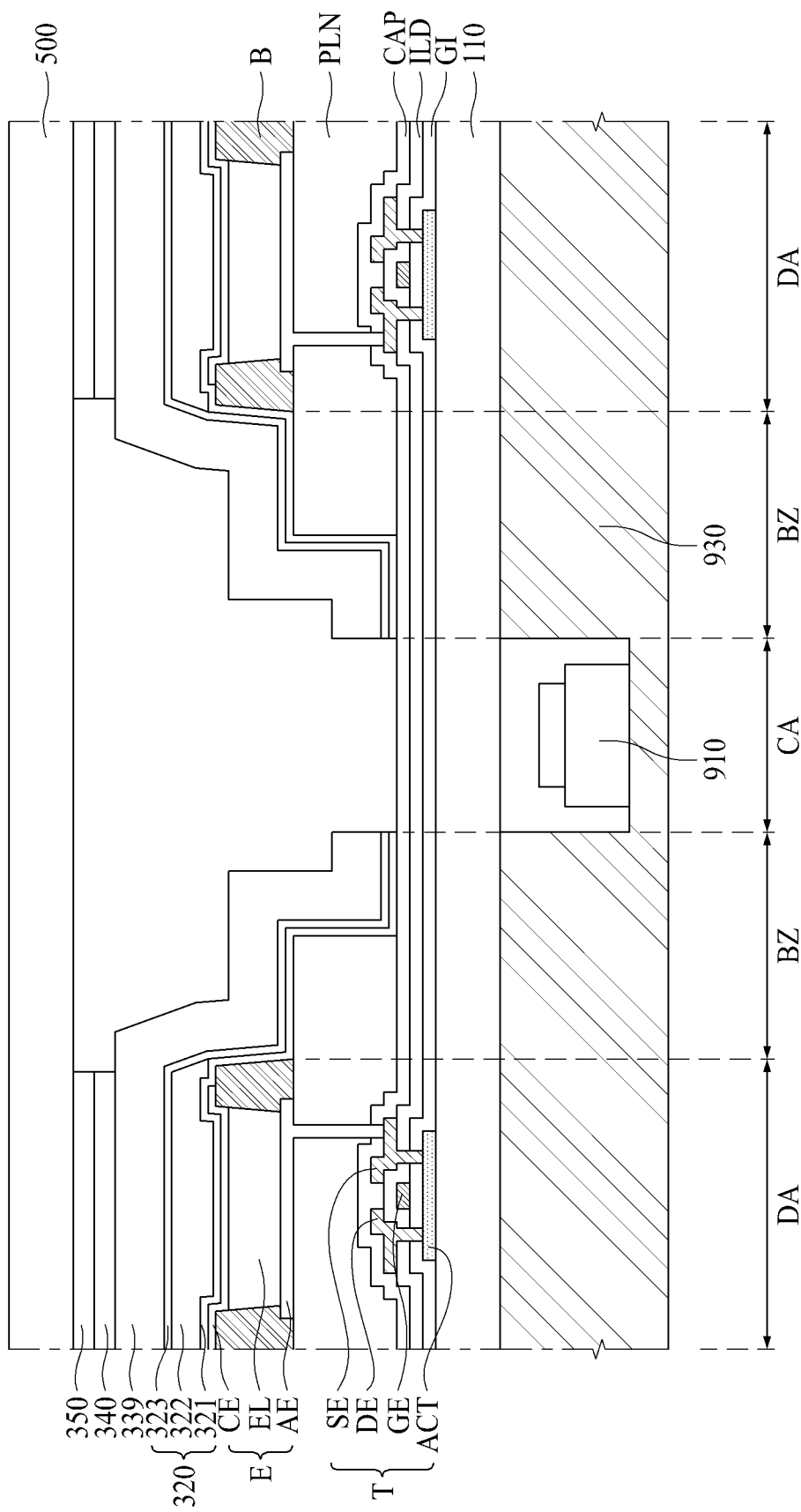
FIG. 12 is a cross-sectional view taken along line V-V' shown in FIG. 11.

FIG. 11 is a plane view illustrating a display apparatus according to one embodiment of the present disclosure, and FIG. 12 is a cross-sectional view taken along line V-V' shown in FIG. 11. In the display apparatus of FIGS. 11 and 12, an overcoat layer 320, a functional film 340, an adhesive layer 350 and a cover window 500 are the same as those of the display apparatus 10 in FIGS. 1 to 10 and their repeated description will be omitted.

Referring to FIGS. 11 and 12, the display apparatus 20 according to one embodiment of the present disclosure comprising a hole area CA, a bezel area BZ surrounding the hole area CA, and a display area DA surrounding the bezel area BZ comprises a base substrate 110 overlapped with the hole area CA, the bezel area BZ and the display area DA, a thin film transistor T provided on the base substrate 110 and overlapped with the display area DA, a light emitting diode E provided on the thin film transistor T and electrically connected with the thin film transistor T, an encapsulation portion 320 covering the light emitting diode E, and an optical module 910 arranged to overlap the hole area CA and arranged below the base substrate 110.

The display apparatus 20 according to one embodiment of the present disclosure may comprise at least one thin film transistor T. According to one embodiment, the thin film transistor may include an active layer ACT, a gate electrode GE formed on the active layer ACT, a gate insulating film GI arranged between the active layer ACT and the gate electrode GE, a source electrode SE connected to one side of the active layer ACT, and a drain electrode DE connected to the other side of the active layer ACT, and may further include an inter-layer dielectric (ILD) layer protecting the thin film transistor while spacing the gate electrode GE, the source electrode SE and the drain electrode DE apart from one another, and a capping layer CAP covering the thin film transistor T.

The gate insulating layer GI is arranged on the base substrate 110. The gate insulating layer GI may be made of a single layer of silicon nitride SiNx or silicon oxide SiOx or a multi-layered layer of silicon nitride SiNx and silicon oxide SiOx. The gate insulating layer GI includes a contact hole for contacting each of the source electrode SE and the drain electrode DE to each of source and drain areas of the active layer ACT.

The inter-layer dielectric ILD layer may be provided to cover the gate electrode GE, and may serve to protect the thin film transistor T. A corresponding area of the inter-layer dielectric ILD layer may be removed to contact the active layer ACT with the source electrode SE or the drain electrode DE. For example, the inter-layer dielectric ILD layer may include a contact hole through which the source electrode SE passes, and a contact hole through which the drain electrode DE passes. According to one example, the inter-layer dielectric layer 125 may include a $SiO_2$ film or SiN film, or may include multiple layers that include $SiO_2$ film and SiN film.

The capping layer CAP may be arranged to cover the thin film transistor T which will be described later. The capping layer CAP is an insulating layer for protecting the thin film transistor T. The capping layer CAP may be made of a single layer of silicon nitride SiNx or silicon oxide SiOx or a multi-layered layer of silicon nitride SiNx and silicon oxide SiOx. The capping layer CAP may include a contact hole for connecting the first electrode AE of the light emitting diode E with the thin film transistor T.

Also, the display apparatus 20 according to one embodiment of the present disclosure may further comprise a touch sensor planarization layer 339. The touch sensor planarization layer 339 may be formed to cover an upper portion of a plurality of touch electrodes. Also, the touch sensor planarization layer 339 may be omitted if the display apparatus 20 according to one embodiment does not require a touch function.

The base substrate 110 may be a transparent glass substrate. The base substrate 110 may include, but not limited to, a soda-lime glass or a non-alkali glass. The base substrate 110 may include glass widely used to manufacture a flat display panel. Moreover, the base substrate 110 may include any one or a deposited structure of sapphire glass and gorilla glass.

In this case, the base substrate 110 may be the first glass substrate 110 described in FIGS. 1 to 10, and preferably may be a base substrate 110 which is not provided with a flexible substrate 200.

Therefore, the base substrate 110 may include the first etching surface 110b overlapped with the bending area BA arranged at one side of the display area DA, and bending of the bending area BA of the display apparatus 20 according to one embodiment of the present disclosure may be guided along the first etching surface 110b.

The hole area CA may be formed in at least a portion of the display area DA of the display panel. Also, the bezel area BZ may be defined between the hole area CA and the display area DA. Although FIG. 11 shows that the hole area CA is formed at a center portion of an upper end of the display apparatus 20, a position of the hole area CA is not limited to the example of FIG. 11.

The hole area CA may be defined as an area where the optical module 910 is arranged on the rear surface of the base substrate 110 to overlap the base substrate 110.

The bezel area BZ may be defined as an area surrounding the hole area CA. The bezel area BZ surrounding the hole area CA may be referred to as a buffer area. The bezel area BZ may be an area prepared as some elements are removed as compared with the structure of the display area DA.

As shown in FIG. 12, the gate insulating layer GI, the inter-layer dielectric ILD layer and the capping layer CAP may commonly be formed on the base substrate 110, and if these layers are formed of a transparent inorganic thin film, a driving problem may not occur in the optical module 910. Also, the gate insulating layer GI, the inter-layer dielectric ILD layer and the capping layer CAP, which are overlapped with the hole area CA, may be prepared by being selectively removed.

Next, the thin film transistor T and the light emitting diode E may be provided to overlap only the display area DA. In detail, a mask pattern may be designed so that the thin film transistor T and the light emitting diode E may not be formed in the hole area CA, whereby the thin film transistor T and the light emitting diode E may be provided only in the display area DA. Also, in case of the light emitting diode E, a fine metal mask FMM may be used to control the light emitting layer EL and the cathode electrode CE to be formed in only the display area DA.

Next, the overcoat layer 320 may be a multi-encapsulation film that includes at least one inorganic film and at least one organic film. As shown in FIG. 12, the overcoat layer 320 may include a first encapsulation film 321, a second encapsulation film 322 and a third encapsulation film 323. In this case, the first encapsulation film 321 and the third encapsulation film 323 may be inorganic encapsulation films, and the second encapsulation film 322 may be an organic encapsulation film. If the organic encapsulation film 322 is formed of the bezel area BZ and the hole area CA, a problem may occur in driving of the optical module 910 that recognizes information input through the hole area CA. In the present disclosure, an ink jet method may be used to control the second encapsulation film 322 not to be provided in the hole area CA.

The touch sensor planarization layer 339 may be prepared through a patterning process to correspond to the display area DA or the bezel area BZ.

The functional film 340 and the adhesive layer 350 may be provided not to overlap the bezel area BZ and the hole area CA. The functional film 340 and the adhesive layer 350 may be provided as an area overlapped with the hole area CA or the bezel area BZ is removed through a punching process. An area of the functional film 340 overlapped with the hole area CA or the bezel area BZ may selectively be removed through a bleaching process.

The display apparatus 20 according to one embodiment of the present disclosure may be provided such that the flexible substrate 200 is formed in only the bending area BA described in FIGS. 1 to 10. Therefore, the flexible substrate 200 may not be formed in the base substrate 110 or the first glass substrate 110, whereby a driving condition of the optical module 910 may be improved.

In this case, the optical module 910 may be a camera module, and the embodiment of the present disclosure is not limited to this example. For example, the optical module 910 may be an illumination sensor or a fingerprint sensor.

The display apparatus 20 according to one embodiment of the present disclosure may further comprise an optical module mount 930 on which the optical module 910 is mounted. According to one example, the optical module mount 930 may be a circuit board in which the optical module 910 is packaged.

It will be apparent to those skilled in the art that various modifications and variations can be made in the display apparatus of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display apparatus comprising a display area, a non-display area surrounding the display area, and a bending area formed in at least one side of the non-display area, the display apparatus comprising:
- a first glass substrate provided in the display area;
- a second glass substrate provided in the non-display area; and
- a flexible substrate provided to overlap the bending area.

2. The display apparatus of claim 1, wherein the first glass substrate includes a first etching surface provided to overlap the bending area.

3. The display apparatus of claim 1, wherein the second glass substrate includes a second etching surface provided to overlap the bending area.

4. The display apparatus of claim 1, wherein the flexible substrate includes a material having etching resistance for a glass etching solution.

5. The display apparatus of claim 1, wherein the flexible substrate includes at least one of silicone based organic matter, urethane, polyimide and photo acryl.

6. The display apparatus of claim 1, wherein the flexible substrate has a thickness of 10 um or less.

7. The display apparatus of claim 1, further comprising a link line portion formed at an upper portion of the flexible substrate.

8. The display apparatus of claim 1, further comprising an elastic member arranged below the flexible substrate.

9. The display apparatus of claim 5, wherein the elastic member has an elongation rate of 100% or more.

10. The display apparatus of claim 1,
wherein the first glass substrate includes a first flat surface overlapped with the display area and a first rear surface facing the first flat surface, the second glass substrate includes a second rear surface spaced apart from the first rear surface and arranged to face the first rear surface, and
the display apparatus further comprises an adhesive member fixing the first rear surface to the second rear surface by contacting each of the first rear surface and the second rear surface.

11. A display apparatus comprising a hole area, a bezel area surrounding the hole area, and a display area surrounding the bezel area, the display apparatus comprising:
- a base substrate overlapped with the hole area, the bezel area and the display area;
- a thin film transistor provided on the base substrate and overlapped with the display area;
- a light emitting diode provided on the thin film transistor and electrically connected with the thin film transistor;
- an encapsulation portion covering the light emitting diode; and
- an optical module arranged to overlap the hole area and arranged below the base substrate.

12. The display apparatus of claim 11, wherein the base substrate is a transparent glass substrate.

13. The display apparatus of claim 11, further comprising an optical module mount in which the optical module is packaged.

14. The display apparatus of claim 11, further comprising a bending area arranged at one side of the display area, wherein the base substrate includes a first etching surface overlapped with the bending area.

15. The display apparatus of claim 11, further comprising a cover window arranged to face the base substrate and arranged on the light emitting diode.

* * * * *